(12) United States Patent
Salser, Jr. et al.

(10) Patent No.: US 8,610,594 B1
(45) Date of Patent: Dec. 17, 2013

(54) MULTIPLE MODE AMR SYSTEM WITH BATTERY FREE TRANSMITTERS

(75) Inventors: Floyd Stanley Salser, Jr., Ocala, FL (US); Roger Allcorn, Monmouth (GB)

(73) Assignee: FC Patents, LLC., Ocala, FL (US)

( * ) Notice: Subject to any disclaimer, the term of this patent is extended or adjusted under 35 U.S.C. 154(b) by 0 days.

(21) Appl. No.: 13/555,065

(22) Filed: Jul. 20, 2012

Related U.S. Application Data

(60) Continuation-in-part of application No. 12/050,123, filed on Jun. 3, 2008, now abandoned, and a continuation-in-part of application No. 13/159,360, filed on Jun. 13, 2011, which is a continuation-in-part of application No. 12/143,822, filed on Jun. 23, 2008, now Pat. No. 7,994,935, which is a continuation of application No. 10/989,811, filed on Nov. 16, 2004, now Pat. No. 7,498,953, said application No. 13/159,360 is a division of application No. 12/050,160, filed on Mar. 17, 2008, now Pat. No. 7,980,317, and a continuation of application No. 12/050,123, filed on Jun. 3, 2008, now abandoned, which is a division of application No. 12/050,138, filed on Mar. 17, 2008, now Pat. No. 8,164,480.

(60) Provisional application No. 60/895,104, filed on Mar. 15, 2007.

(51) Int. Cl.
*G08B 23/00* (2006.01)

(52) U.S. Cl.
USPC .................................................. 340/870.02

(58) Field of Classification Search
USPC ............................................... 340/870.02
See application file for complete search history.

(56) References Cited

U.S. PATENT DOCUMENTS

| | | | | |
|---|---|---|---|---|
| 6,127,799 A * | 10/2000 | Krishnan | | 320/104 |
| 6,882,128 B1 * | 4/2005 | Rahmel et al. | | 320/101 |
| 7,375,637 B2 * | 5/2008 | Mickle et al. | | 340/572.1 |
| 7,667,283 B1 * | 2/2010 | Smith et al. | | 257/432 |

* cited by examiner

*Primary Examiner* — Stephen W Jackson
(74) *Attorney, Agent, or Firm* — Monty Simmons; Simmons Patents

(57) ABSTRACT

The disclosed inventions include and apparatus and method for providing a universal Automatic Meter Reading (AMR) system. Such system may be configured to work in a plurality of modes including a walk-bay, drive-by and fixed network mode. For some configurations RF scavenging technology is used to power the transmitter.

20 Claims, 15 Drawing Sheets

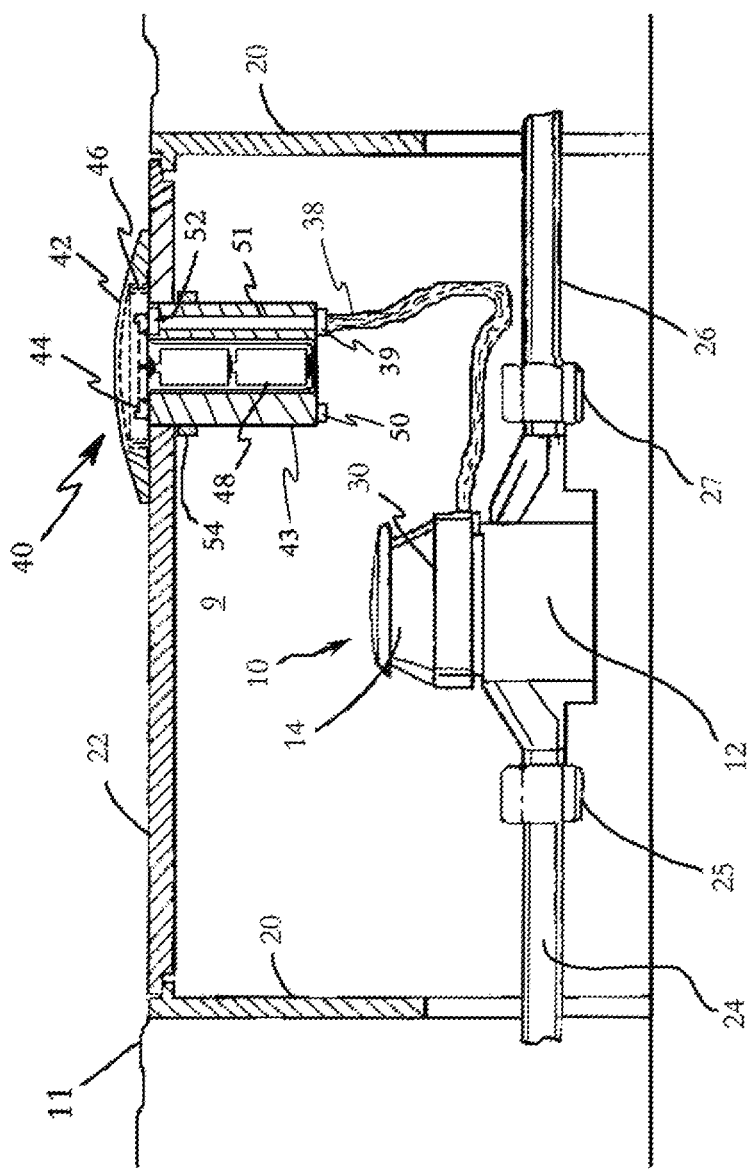

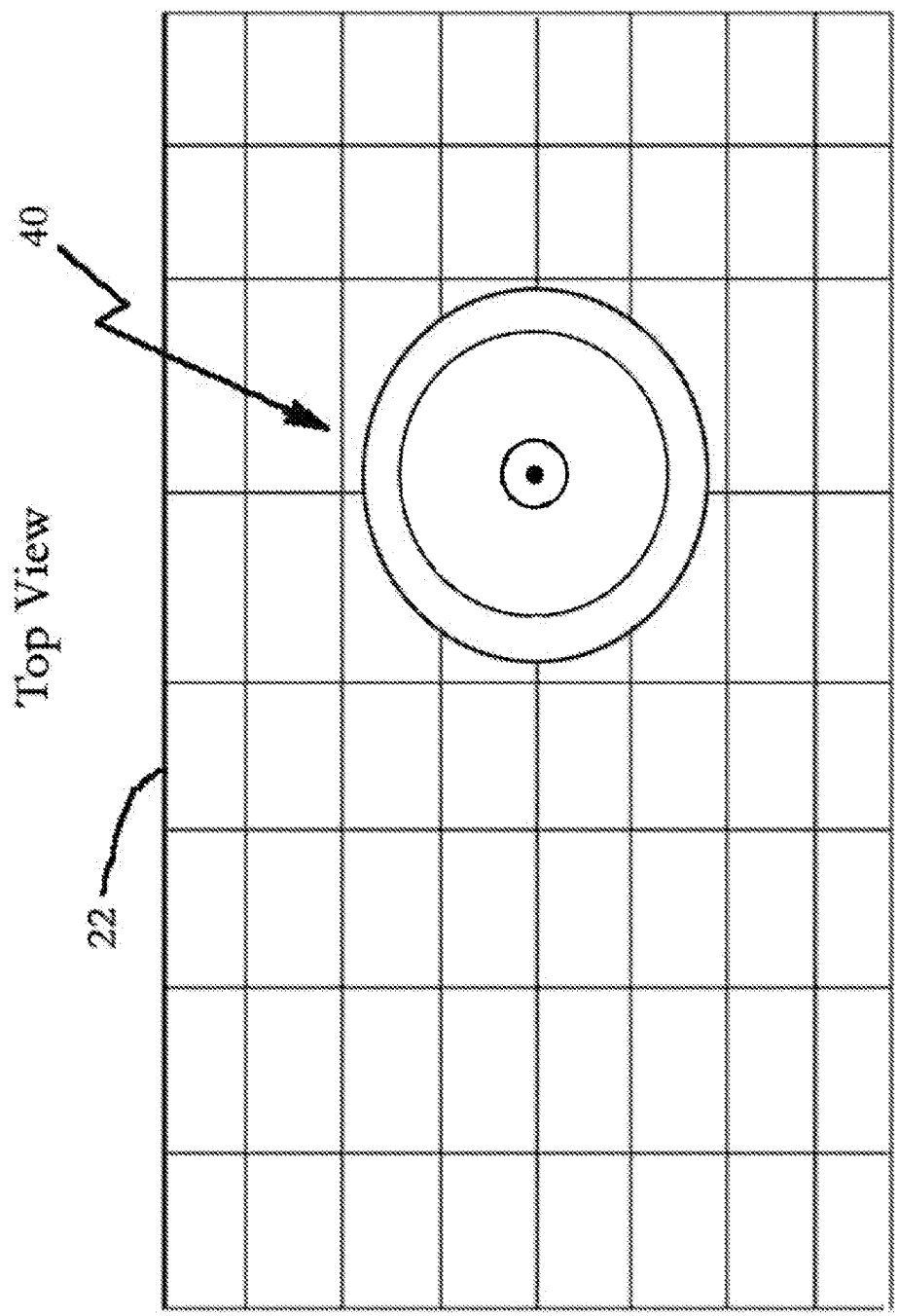

MULTIPLE MODE AMR SYSTEM WITH BATTERY FREE TRANSMITTERS

CLAIM TO PRIORITY

This application claims priority to and is a continuation in part of application Ser. No. 13/159,360, filed Jun. 13, 2011, which is a continuation in part of application Ser. No. 12/143,822 (now U.S. Pat. No. 7,994,935) filed on Jun. 23, 2008, which is a continuation of Ser. No. 10/989,811, (now U.S. Pat. No. 7,498,953), filed on Nov. 16, 2004; application Ser. No. 13/159,360 is further a division of application Ser. No. 12/050,160 (now U.S. Pat. No. 7,980,317), filed on Mar. 17, 2007, which claims priority to provisional application 60/895,104, filed on Mar. 15, 2007; and is further a continuation in part to application Ser. No. 12/050,123, filed on Jun. 3, 2008, with is a divisional to Ser. No. 12/050,138, filed on Mar. 17, 2008, the entire contents of all such references are hereby incorporated herein by this reference for all that they disclose for all purposes.

TECHNICAL FIELD OF THE INVENTION

The present invention relates to an apparatus and method for transmitting utility meter data from a utility meter to a remote location. One embodiment of the apparatus comprises a battery free transmitter configured to operate in a plurality of modes including walk-by, drive-by and fixed network mode. The system also includes an auto calibration feature for determining the transmit power for the transmitter associated with a water meter as well as novel transmit and receiving modes.

BACKGROUND

Utility meters, including mechanical, electromechanical, and solid state meters, are well known and have been used for many years to measure the consumption of resources such as water, gas and electricity. Water meters, for example, generate data indicative of the consumption of water, where such data is used for billing purposes. Initially, utility meters were mechanical devices. As electronic technology advanced, such technology became smaller and less expensive, and thus, more suitable for use in the highly competitive and cost sensitive utility meter market. As such, the use of electromechanical (hybrid meters) and electronic meters has become more common. Indeed, most modern electricity meters, for example, are electronic meters (static meters).

Traditionally, meter reading personnel would periodically travel to each utility meter installation site and inspect a meter installation and manually record consumption data. The customer would then receive a bill based on such collected data. Today, increasing numbers of utilities are installing the most advanced reading technologies available. Such systems typically included a transmitter/transceiver associated with the utility meter for transmitting utility meter data to a remote location thereby offering improved data accuracy at the lowest meter reading cost available while eliminating the need for meter access (which is particularly useful for hazardous reading environments).

Notably, AMR systems used by water utilities include devices installed at the water meter configured for transmitting a data signal. Such devices are particularly sensitive to power consumption as most water meter installations are battery operated. As a result, such systems typically employ power saving schemes such as a drive-by/walk-by system.

For walk-by and drive-by AMR systems, a transmitter is associated with a utility meter and configured to wake up and transmit consumption data at a predefined time for a predefined duration in time (e.g. transmitter wakes up every day at 4:00 pm and transmits a 10 ms data burst every 10 seconds until 6:00 pm and then goes back into sleep mode). During the active period of the transmitter (between 4:00 pm and 6:00 pm for the above example) a utility representative either walks-by or drives-by the utility meter to receive the transmitted consumption data signal. Such a one-way system was disclosed in commonly owned U.S. patent application Ser. No. 10/989,811 filed on Nov. 16, 2004.

For yet another walk-by/drive-by AMR system, a transceiver replaces the transmitter. For this AMR system a simple receiver is configured for receiving a wake-up signal to be transmitted by utility personnel as he drives-by/walks-by a meter installation. When a wake-up signal is received, the AMR system's transmitter is activated and starts transmitting a data signal. Such a one-way system was disclosed in commonly owned U.S. patent application Ser. No. 10/989,811 filed on Nov. 16, 2004.

Conversely, a fixed network system eliminates the need to drive-by/walk-by a utility meter. For such a system, either the transmitter system (a) tracks the passage of time and transmits a data signal according to a predefined schedule or (b) the transmitter system includes a transceiver that listens for a wakeup signal. When a wake-up signal is received, the transmitter activates and transmits a consumption data signal to a remote location. Such a two-way system was disclosed in commonly owned U.S. Pat. No. 7,283,063 (application filed Jul. 7, 2005).

Prior to the development of the above described AMR transmitters there was a problem with prior art systems in that prior art drive-by/walk-by and Fixed network AMR systems were not compatible with each other. Restated, prior art drive-by/walk-by transmitters were not configured to operate in fixed network systems and vice-versa. For example, a typical drive-by/walk-by system transmitter may transmit a 0.08 Watt data signal while a typical fixed network transmitter may operate at up to 1.0 watts (or perhaps more in some frequency bands). Additionally, it should be appreciated that for a two way communication system, if a first transceiver (T1) transmits an X-watt signal to a second transceiver (T2), transceiver T2 should transmit an X-watt response signal (to minimize the risk of saturating the receiver). To use an analogy, if person A whispers to person B, person B should whisper back to person A, not shout back.

Such incapability between walk-by/drive-by/fixed network systems presents a problem to water utilities. The technology that provides the above described advantages is not free and utilities must be careful to select the best AMR system for their needs. Additionally, while a fixed network system may clearly the best technical solution for a particular utility; such utility may not have the funds to install a fixed network solution. Thus, such a utility may simply purchase a system it can afford such as a less expensive walk-by/drive-by system. When the above described utility decides to upgrade to a fixed network solution as funds become available, it must replace the drive-by transmitters with RF systems suitable for a fixed network. Such an upgrade process is clearly a waste of resources as perfectly good transmitters are scrapped.

What is needed is an AMR device configured to be associated with a water utility meter that may be configurable to operate in one of a plurality of modes (such as a walk-by, drive-by and a Fixed Network mode) that includes auto-calibration routines to configure the network. With such an AMR device, a water utility may first implement a walk-by/ drive-by AMR system and then upgrade to a fixed network solution at minimal costs. Additionally, there is a need for a self calibrating system that can determine the optimum transmitter power level to avoid having one transmitter "shout" when it could "whisper" thereby lowering power consumption while improving communication integrity.

Yet another problem with transmitters associated with water meters is the power source. All know prior art transmitters associated with a water meter include a battery. While most prior art utility meters powered by a battery use batteries with a life span of 5 or more years, the cost of ownership of a transmitter with a battery compared to a transmitter with no battery is significantly greater. In fact, perhaps the most common question a potential owner of a utility meter will ask is: "how long will the batteries last?" In various embodiments of the disclosed invention, the system includes transmitters that scavenge electromagnetic energy from the environment that is stored in electronic components such as capacitors and perhaps batteries. Restated, embodiments of the current invention include a battery free transmitter design.

SUMMARY

Objects and advantages of the invention will be set forth in the following description, or may be obvious from the description, or may be learned through practice of the invention.

Broadly speaking, a principal object of the present invention is to provide universal transmitter for transmitting data from a metering device to a remote location wherein said transmitter can transmit using power derived from scavenged electromagnetic energy.

Another general object of the present invention is to provide a method and apparatus for a universal transmitter that can work in a plurality of modes including a drive-by, walk-bay, and fixed network mode.

Still another general object of the present invention is to provide an AMR system comprising a data collector with functionally-self-healing features.

Yet another general object of the present invention is to provide for a data collector with self-healing features wherein said data collector transmits a wakeup signal that also provides power to the power storage components used in a remote battery free transmitter.

Additional objects and advantages of the present invention are set forth in, or will be apparent to those skilled in the art from, the detailed description herein. Also, it should be further appreciated that modifications and variations to the specifically illustrated, referenced, and discussed steps, or features hereof may be practiced in various uses and embodiments of this invention without departing from the spirit and scope thereof, by virtue of the present reference thereto. Such variations may include, but are not limited to, substitution of equivalent steps, referenced or discussed, and the functional, operational, or positional reversal of various features, steps, parts, or the like. Still further, it is to be understood that different embodiments, as well as different presently preferred embodiments, of this invention may include various combinations or configurations of presently disclosed features or elements, or their equivalents (including combinations of features or parts or configurations thereof not expressly shown in the figures or stated in the detailed description).

Additional embodiments of the present subject matter, not necessarily expressed in this summarized section, may include and incorporate various combinations of aspects of features or parts referenced in the summarized objectives above, and/or features or components as otherwise discussed in this application.

Those of ordinary skill in the art will better appreciate the features and aspects of such embodiments, and others, upon review of the remainder of the specification.

BRIEF DESCRIPTION OF THE DRAWINGS

A full and enabling description of the present subject matter, including the best mode thereof, directed to one of ordinary skill in the art, is set forth in the specification, which makes reference to the appended figures, in which:

FIG. 1 is a graphic illustration of a side elevated view of an in ground pit (9) enclosure, including a partial cut away section, housing a fluid meter attached to a communication apparatus;

FIG. 1b is a top view a one exemplary embodiment of a communication apparatus resting generally on top of a pit lid (22);

Figure 2A:
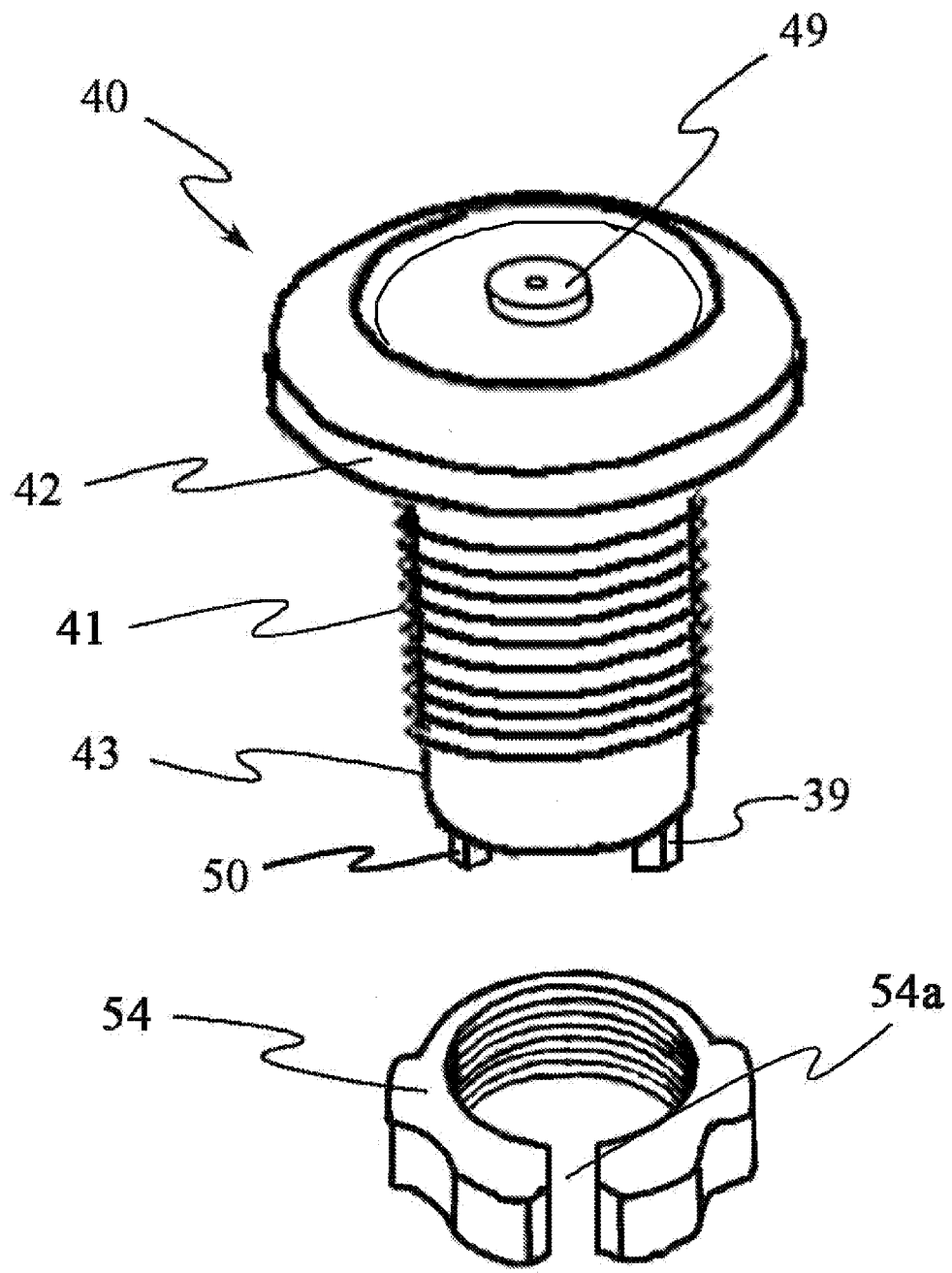
FIG. 2a is a side perspective view of one exemplary embodiment of a communication apparatus with securing nut (54)

Repeat use of reference characters throughout the present specification and appended drawings is intended to represent the same or analogous features or elements of the present technology.

DETAILED DESCRIPTION

Reference now will be made in detail to the embodiments of the invention, one or more examples of which are set forth below. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used on another embodiment to yield a still further embodiment. Thus, it is intended that the present invention covers such modifications and variations as come within the scope of the appended claims and their equivalents. Other objects, features, and aspects of the present invention are disclosed in or may be determined from the following detailed description. Repeat use of reference characters is intended to represent same or analogous features, elements or steps. It is to be understood by one of ordinary skill in the art that the present discussion is a description of exemplary embodiments only, and is not intended as limiting the broader aspects of the present invention.

It should be appreciated that this document contains headings. Such headings are simply place markers used for ease of reference to assist a reader and do not form part of this document or affect its construction.

For the purposes of this document two or more items are "mechanically associated" by bringing them together or into relationship with each other in any number of ways including a direct or indirect physical connection that may be releasable (snaps, rivets, screws, bolts, etc.) and/or movable (rotating, pivoting, oscillating, etc.)

Similarly, for the purposes of this document, two items are "electrically associated" by bringing them together or into relationship with each other in any number of ways. For example, methods of electrically associating two electronic items/components include: (a) a direct, indirect or inductive communication connection, and (b) a direct/indirect or inductive power connection. Additionally, while the drawings illustrate various components of the system connected by a single line, it will be appreciated that such lines represent one or more connections or cables as required for the embodiment of interest.

While the particulars of the present invention may be adapted for use providing Automatic Meter Reading (AMR) capabilities and associated technology to utility meters metering the consumption of commodities such as gas, water, oil, electricity, etc., the examples discussed herein are primarily in the context of water consumption.

FIG. 1 shows a side view, including a partial cutaway section, of an exemplary utility meter (10) configured with Automatic Meter Reading (AMR) technology wherein the meter is housed in a below ground enclosure (9), hereafter referred to as pit (9). Pit (9) is shown comprising sides (20) and lid (22). Utility meter (10) is shown comprising a fluid chamber (12) and a register (14). The bottom of register (14) releasably attaches to the top of fluid chamber (12) forming an enclosed void (not shown) between register (14) and fluid chamber (12). Fluid chamber (12) comprises water inlet (25) and water outlet (27). Water line (24), connects to a water source at one end, runs into pit (9) and attaches to fluid chamber inlet (25) at the opposite end. Water line (26) attaches to fluid chamber outlet (27) at one end and continues through pit (9) to a water consumer. Fluid chamber (12) further houses a rotating element (not shown) that is placed in the path of fluid flow through the meter. The rotating element may be constructed of magnetic material or, alternatively, may be associated with magnetic material (e.g. a magnet). As the rotating element rotates in response to fluid flow through meter (10), a rotating magnetic field is generated. It will be appreciated that the rotating element in fluid chamber (12) may be replaced by other technologies that create other types of magnetic fields that vary over time (e.g. an oscillating element that generates an oscillating magnetic field) without departing from the scope of this invention.

Register (14) houses elements for detecting a rotating magnetic field and associating such rotations with water consumption thereby generating resource consumption data. Register (14) may also house components for displaying consumption data. Alternatively, Register (14) may simply output pulses to an electronic device associated with register (14) wherein such pulses are relatable to the amount of water flowing through meter (10). Such technology is well known and understood by those skilled in the art, and a detailed explanation thereof is not necessary for purposes of describing the method and system according to the present invention.

Also shown in FIG. 1 is a communication apparatus (40) for transmitting data from meter (10) to a remote location. Communication apparatus (40) comprises an enclosure having a top-section (42) and a depending base (43). Top-section (42) rests generally on top of the pit lid (22) substantially adjacent to an opening through the pit lid. Depending base (43) extends from top-section (42) to a point at least partly through the pit lid opening. As can be seen in FIG. 1, depending base (43) extends completely through pit lid (22). For this embodiment of the invention, communication apparatus (40) is associated with meter (10) through a wire communication link (38). As shown in FIG. 2a, depending base (43) may further comprise threads (41) suitably sized for receiving securing nut (54). Securing nut (54) may include gap (54a) to provide a means for installing and removing securing nut (54) without disconnecting communication link (38).

FIG. 1b shows a top view of communication apparatus (40) resting generally on top of pit lid (22). Coil/core interface (49) is shown in the center of top-section (42) although interface (49) may be located anywhere on top-section (40) without departing from the scope of the present invention. It should be noted that for the meter installation shown in FIG. 1, pit lid (22) is generally at ground level. It will be appreciated, however, that communication apparatus (40) may be installed in above ground enclosures and pit lid (22) may be the "side" of such enclosure without departing from the scope and spirit of the present invention.

Figure 2B:
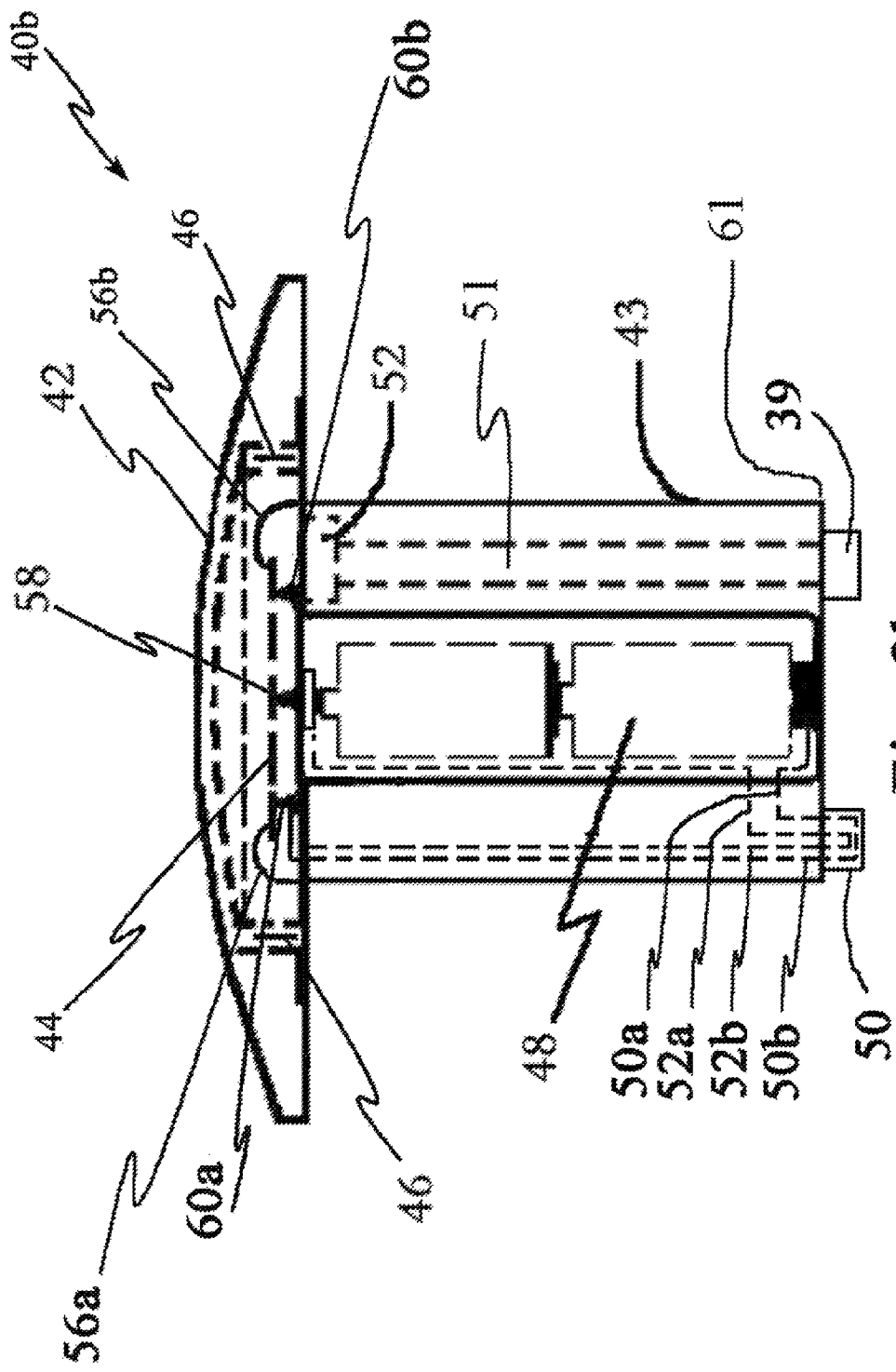
FIG. 2b is a side elevated view, with a partial phantom view, of a communication apparatus housing comprising a top-section and a depending base comprising batteries.

Referring now to FIG. 2b, a side view, including a partial phantom view, of one embodiment of communication apparatus (40) is shown. Communication apparatus (40) has a circuit board (44) disposed within top-section (42) and supported by stand-offs (58, 60a, 60b). Circuit board (44) may also be secured in top-section (42) by plastic grip tabs integral to the housing or any other suitable means. For this embodiment, stand-off (60a) and stand-off (60b) also provide a ground connection between circuit board (44) and power source (48) (described later). Stand-off (58) provides a power connection to circuit board (44). Resilient board clips (56a, 56b) secure circuit board (44) against the stand-offs thereby securing the circuit board within top-section (42). Such resilient clip/stand-off technology provides for a bolt/screw free design that simplifies assembly and lowers manufacturing costs.

Figure 3:
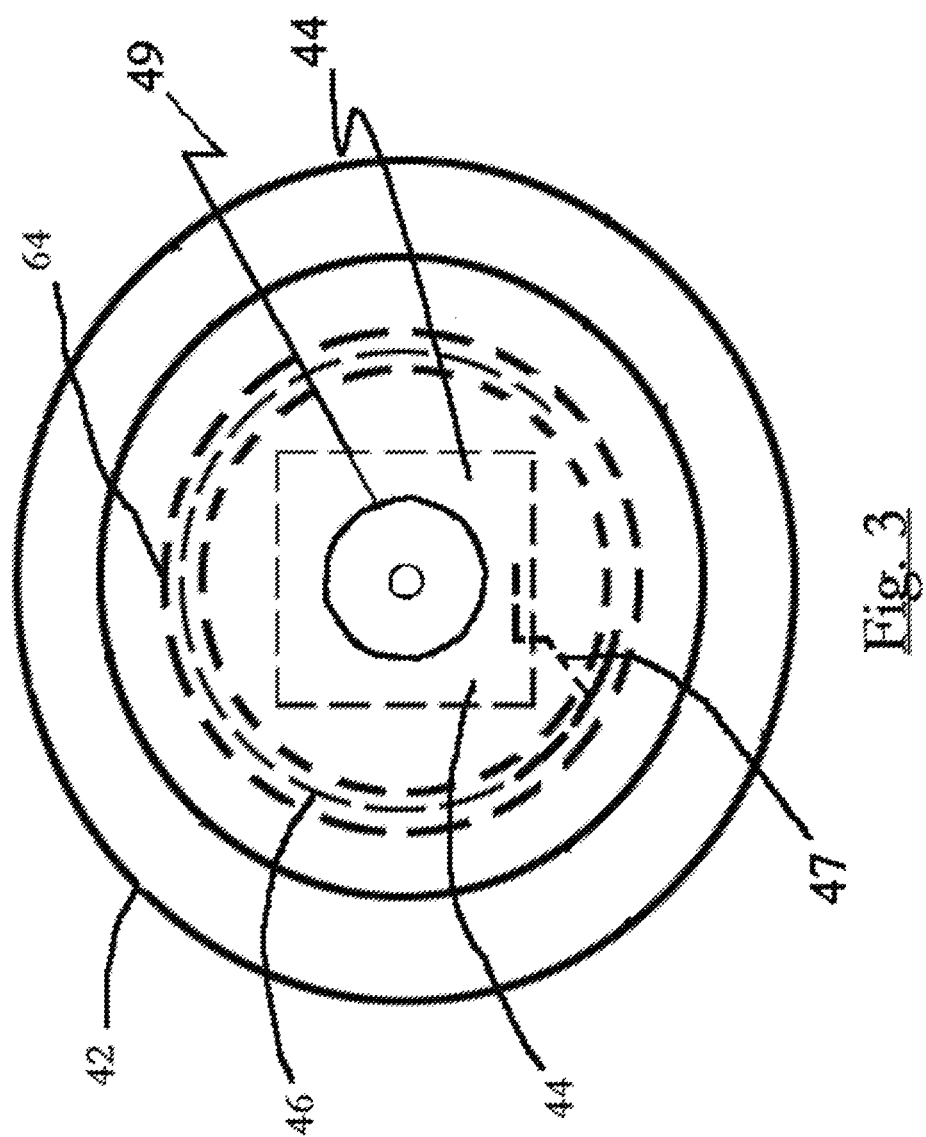
FIG. 3 is a top view, including a partial phantom view, of a transmitter top-section (42)

Circuit board (44) comprises transmitter circuitry (one exemplary transmitter is described below) associated with antenna (46). It should be noted that the transmitter circuitry may be associated with any type of substrate other than a circuit board without departing from the scope and spirit of the disclosed inventions. Both circuit board (44) and antenna (46) are at least partially disposed within top-section (42). Additionally, antenna (46) may be disposed at least partially outside of top-section (42) to facilitate an improved electromagnetic radiation pattern. Alternatively, antenna (46) by be integral to circuit board (44), such as a trace or a slot antenna formed on/within circuit board (44). As shown in FIG. 3, for this embodiment of the invention, antenna (46) is positioned in antenna guide (64) and at least partially circles circuit board (44). Any type of suitable antenna technology may be used and such antenna technology is well known and understood by those skilled in the art, and a detailed explanation thereof is not necessary for purposes of describing the method and system according to the present invention.

Antenna (46) is coupled to the transmitter circuitry via connector (47). Notably, any suitable apparatus or method may be used for associating antenna (46) directly or indirectly (inductive/capacitive) to the transmitter circuitry so that data-signals generated by the transmitter are propagated by antenna (46) to a remote location. Exemplary remote locations include a hand held computer, perhaps just a few feet away from the meter installation and hundreds of feet away from the meter. A remote location may be in a vehicle equipped with a receiver wherein the vehicle is driven by the meter installation. Depending on the transmitter power level, a remote location may be miles away from the meter installation site.

As shown in FIG. 2b, a power source (48) is associated with circuit board (44) via wired connections (50a, 50b, 52a, 52b) and is configured for supplying power to the circuitry on circuit board (44). For this embodiment of the present invention, power source (48) comprises two batteries connected in series and disposed within depending base (43). It will be appreciated that power source (48) may only comprise one battery or three or more batteries without departing from the scope and spirit of the invention. Additionally, as will be described in detail later, embodiments containing no batteries may be used where the batteries are replaced by EM Scavenger technology.

As noted earlier, the transmitter circuitry is associated with meter (10) through a wired transmitter-meter communication link (38) (FIG. 1). For this embodiment of the invention, wired conductors provide a connection between register (14) and depending base connector (39). A communication link runs through conduit (51) to communication connection (52) associated with transmitter board (44). Transmitter-meter communication link (38) is configured for transferring system-data between the transmitter and the meter. System-data is any data generated by meter (10), communication apparatus (40), or stored by a memory associated with the meter (10) or the communication apparatus (40). Exemplary system-data includes a meter identification number, consumption data, tamper data, battery status data, time data, system diagnostic data, or any other type of data. Transmitter-meter communication link (38) will be described in more detail below.

For meter installations located in hostile environments, such as water meter installations, the components within communication apparatus (40) should be adequately protected. For this embodiment of the invention, a potting compound or a sealing material may be use to protect various components of communication apparatus (40). Any suitable potting compound may be used including polymer based materials such as polyurethane or a fiberglass base material. Additionally, suitable sealants include a vulcanizing adhesive/sealant. The potting/sealing material may be injected into the housing thereby encasing substantially all of the top-section (42) components and depending base (43) components within the housing. It will be appreciated that when a potting material/sealant is used to encase the components within top-section (42) and depending base (43) as described above, such components can no longer be easily accessed for replacement or repair.

Alternatively, the housing may be constructed such that only the distal end (61) of depending base (43) has an opening allowing access to the inside of the housing. The distal end (61) may be sealed by a removable end cap (not shown) to prevent contaminates from reaching components within the housing. Such an arrangement could be configured to allow the components within top-section (42) and depending base (43) to be accessed for replacement or repair. It will be appreciated that any type of sealing material or method of sealing the internal components of top-section (42) and depending base (43) within the housing may be used without departing from the scope of the invention.

Referring back to FIG. 2b, power source (48) is now considered. For this embodiment of the present invention, power source (48) is preferably two AA lithium batteries although any type and number of batteries may be used without departing from the scope of the invention. Additionally, as will be described in detail later, some embodiments are battery free (i.e. no battery) where the system is powered by EM scavenging technology. Additionally, for still other embodiments, the system (a hybrid system) may comprise a backup battery and EM scavenging technology.

Power source (48) is associated with circuit board (44) through a multiple conductor wired connection (50a, 50b, 52a, 52b). Conductor (50a) attaches to the negative component of power source (48) at one end, and to auxiliary power connector (50) at the other end. Conductor (50a) is coupled to conductor (50b) within auxiliary power connector (50). Conductor (50b) provides an electrical connection between stand-off post (60a), stand-off post (60b), and conductor (50a). Similarly, conductor (52a) attaches to the positive component of power source (48) at one end, and to auxiliary power connector (50) at the other end. Conductor (52a) is coupled to conductor (52b) within auxiliary power connector (50). Conductor (52b) provides an electrical connection between stand-off post (58) and conductor (52a). One of ordinary skill in the art will appreciated that auxiliary power connector (50) provides a method of connecting additional power sources to communication apparatus (40) as well as providing a means for disconnecting power source (48) from circuit board (44). Such a configuration is particularly useful when power source (48) is encased in a potting material and not easily accessible as described above.

Figure 4:
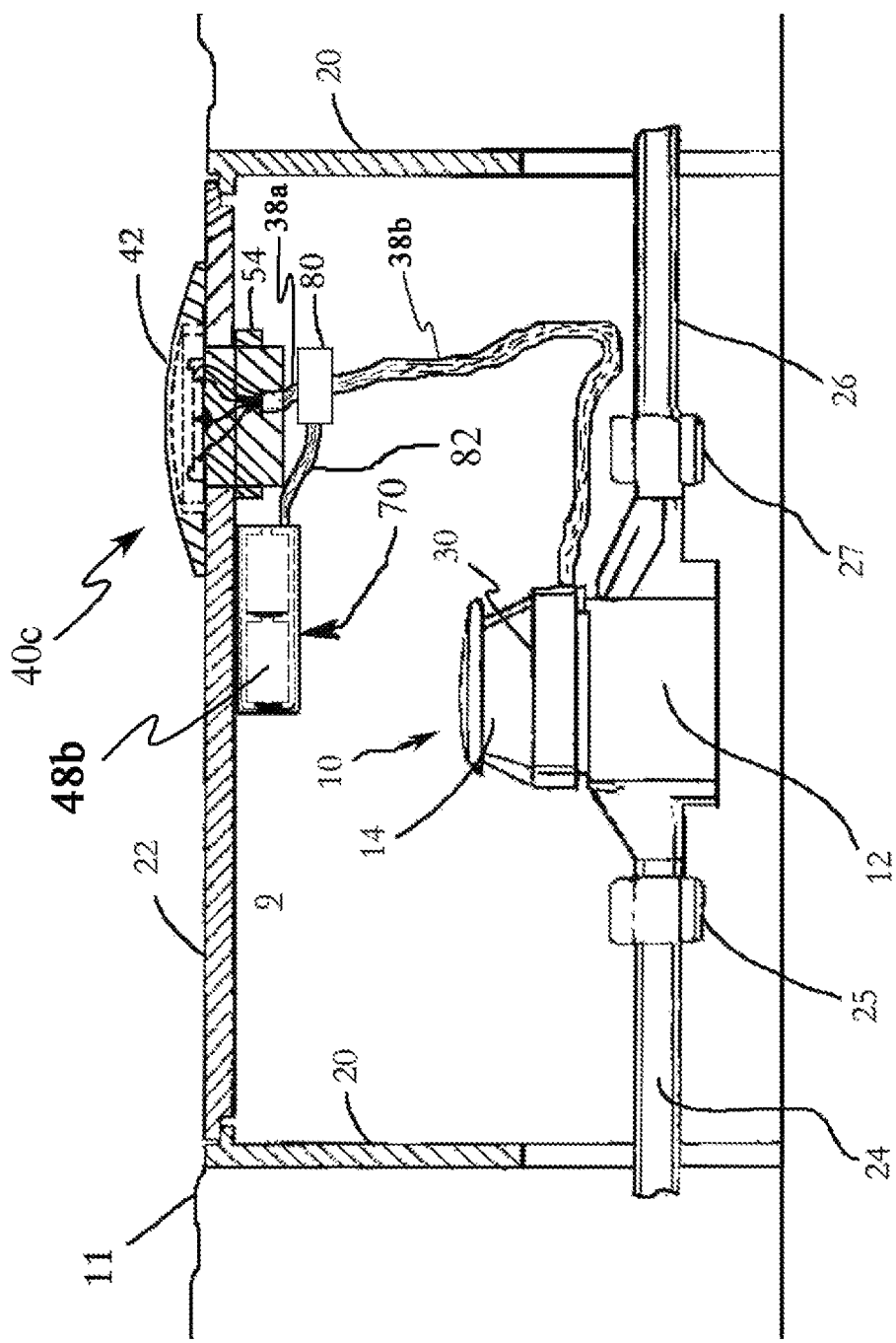
FIG. 4 is a side elevated view of an in ground pit (9) enclosure, including a partial cut away section, housing a fluid meter attached to a communication apparatus with a separate power pack.

Referring now to FIG. 4, a side view, including a partial cutaway section, of an alternative embodiment of the present invention is depicted. For this embodiment, depending base (43) does not house the power source. It should be noted that while depending base (43) is shown extending through pit lid (22) such a configuration is not required. Power pack (70) is shown attached to the under side of pit lid (22) and associated to circuit board (44) via a power-buss (82). Power-buss (82) preferably comprises a power conductor and a ground conductor and runs through the pit lid, via depending base (43). Power-buss (82) may comprise a first access point and a second access point wherein the first access point is associated with the power source (48b) and the second access point is associated with the circuit board (44). Other access points may be provided to allow power connections to other electronic devices associated with communication apparatus (40).

Figure 5:
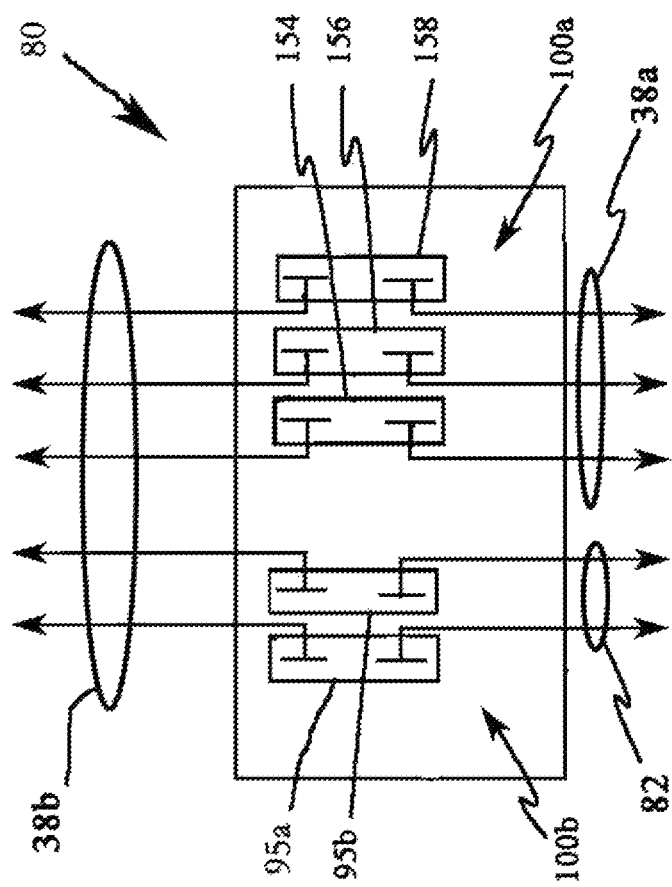
FIG. 5 is a schematic illustration of terminal block (80) for making and breaking connections in a communication link between a communication apparatus and a meter.

Additionally, the power conductor of power-buss (82) may be routed through terminal block (80). Terminal block (80) includes at least one node (i.e. junction) configured for (i) making a connection to the power conductor, (ii) breaking a connection to the power conductor, and (iii) for making and breaking the power conductor connection between the circuit board (44) and the power source (48b). As shown in FIG. 5, the power conductor and a ground conductor of power-buss (82) are both routed through terminal block (80). The power conductor connects to node (95a) while the ground conductor connects to node (95b). Such conductors exit terminal block (80) and are combined with the conductors in communications link (38b) where they eventually are placed in electrical contact with circuit board (44). Such nodes (95a, 95b) may be used to make and break the electrical contact between the power source (48b) and circuit board (44). Additionally, such nodes may be used to attach additional power sources to power-buss (82). While FIG. 5 shows both the power conductor and the ground conductor being routed through terminal block (80), it should be noted that only one such conductor or no power-buss (82) conductors may be routed through terminal block (80). The term "node", as used in this document, simply refers to either a junction for making and breaking an electrical connection, or a terminal point at which two or more branches of a circuit meet (i.e. a point that is common to two circuits or components).

Figure 6:
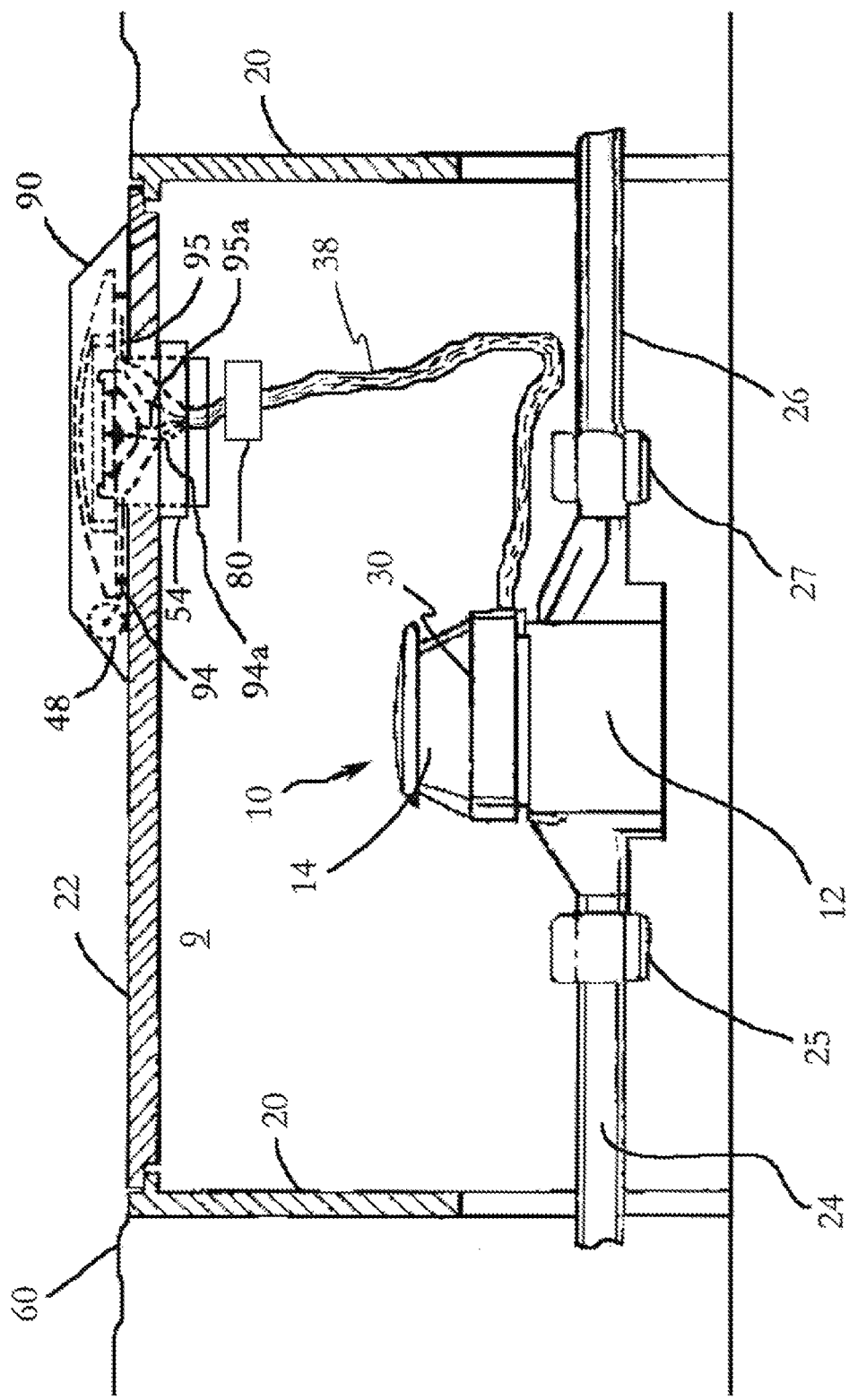
FIG. 6 is a side elevated view of an in ground pit (9) enclosure, including a partial cut away section, housing a fluid meter attached to a communication apparatus comprising a energy converter for recharging or supplying a trickle charge to a power source.

Referring now to FIG. 6, another alternative embodiment of the present invention is disclosed. For this embodiment of the present invention, power source (48), the transmitter and antenna (46) are all located above pit lid (22). Power source (48) comprises a rechargeable battery pack connected to an energy-converter (90). An energy-converter is simply a device that converts energy from one form to another. One example of an energy-converter is photovoltaic-radome (90) which generates electricity by absorbing electromagnetic radiation. Another example of an energy-converter is a betavoltaic device (described later).

Figure 7:
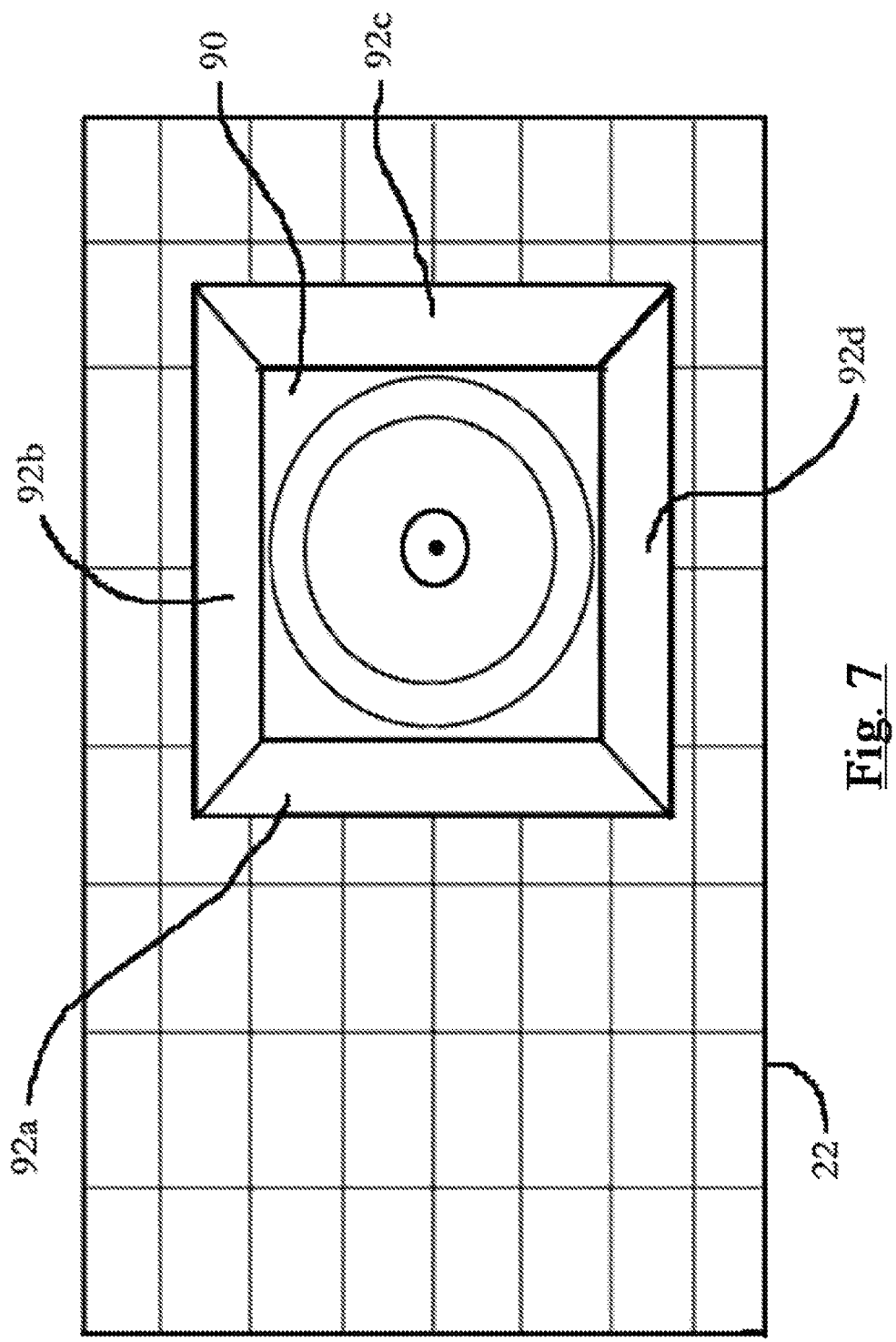
FIG. 7 is a top view of pit lid (22) and a communication apparatus comprising an energy converter.
Figure 8:
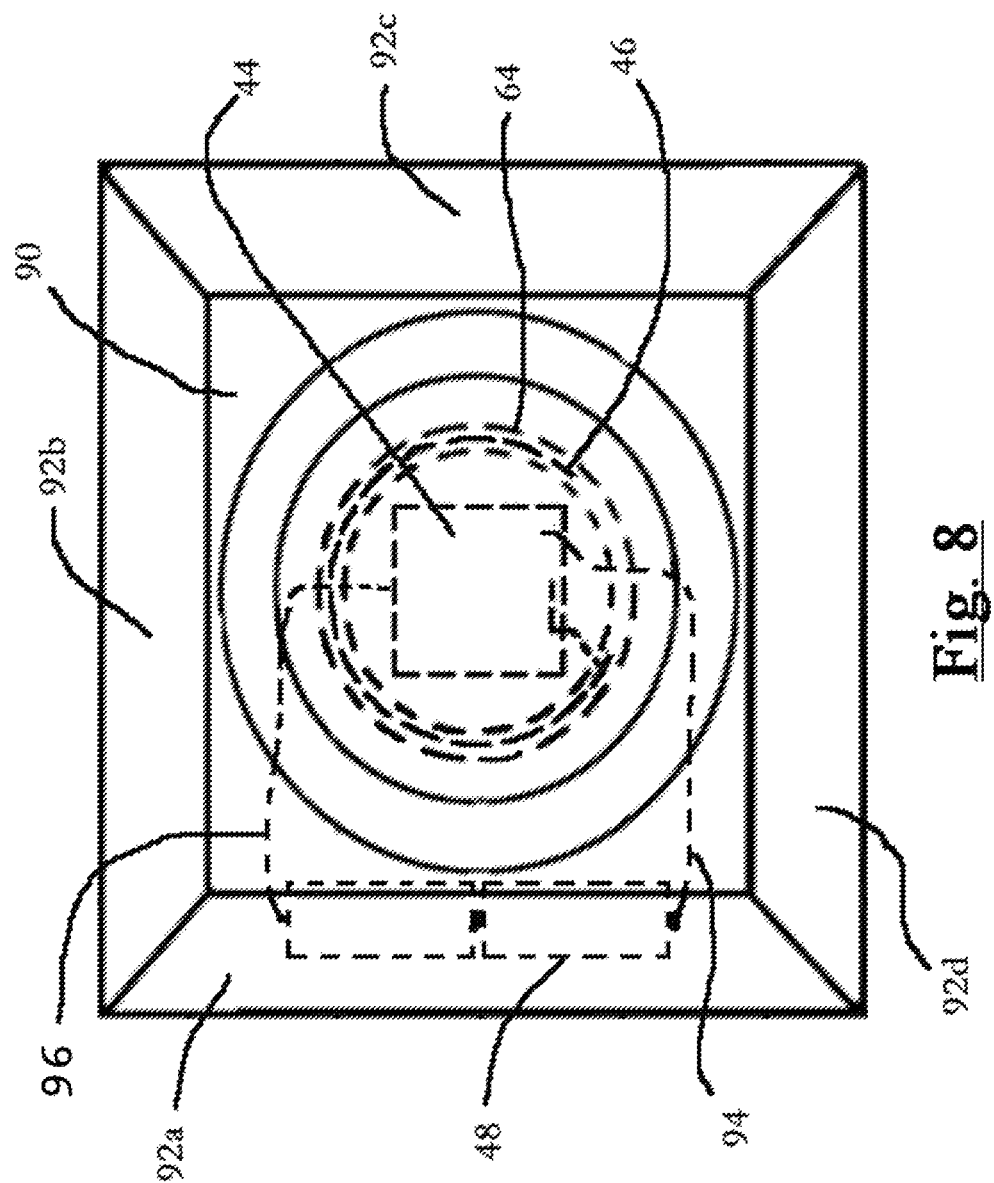
FIG. 8 is a top view of pit lid (22) and a communication apparatus comprising a energy converter including a phantom view of an above pit lid power source connected to circuit board (44)

FIG. 7 shows a top view of communication apparatus (40) comprising energy converter (90). FIG. 8 also shows a top view of communication apparatus (40) with an additional phantom image of power source (48) connected to circuit board (44) via power conductor (94) and ground conductor (96). For this embodiment of the invention, energy converter (90) has four sections of photovoltaic cells (92a, 92b, 92c, 92d) surrounding top-section (42). It will be appreciated that the number and shape of sections (92a-92d) and the number and shape of photovoltaic cells comprising each section may vary depending on any number of parameters including: cost, anticipated installation conditions, antenna design requirements, and power requirements. For the preferred embodiment, each photovoltaic cell section includes three photovoltaic cells, each supplying about 0.5 volts at 30-50 milliamps in full sunlight. Such photovoltaic cells are preferably connected in series to provide power to communications apparatus (40) and/or supply a charging current to power source (48). Additionally, to lower costs, the number of photovoltaic cells may be reduced to supply a simple trickle charge to power source (48) thereby extending the expected life of power source (48).

Similarly, power to communications apparatus (40) may be supplied by a betavoltaic device. The betavoltaic device uses a plurality of PN junctions in silicon to capture and convert electrons emitted from a radioactive gas, such as tritium, into a current. The PN junctions are arranged so as to form a "Dyson shell" surrounding the radioactive gas. To further increase efficiency, the surface area of the silicon surface is increased by adding indentions in such surface. Such indentions are preferably about 1 μm wide and about 40 μm deep. The size of the Dyson shell is selected depending on the application. A relatively smaller shell is selected when the betavoltaic device supplies a trickle charge to power source (48) compared to a relatively larger size shell when the betavoltaic device is used as power source (48) (i.e. a nuclear battery). The Dyson shell may take any suitable form including a sphere, a rectangular box, or a cylindrical tube similar in shape to a typical battery. The techniques for interconnecting PN junctions to form a shell as well as the techniques for adding indentions to the surface of PN junctions are well known in the art and a detailed explanation thereof is not necessary for purposes of describing the method and system according to the present invention.

In yet another embodiment of the invention, the above described hosing comprising top-section (42) and depending base (43) may be formed integral to a pit lid forming a one piece module. Alternatively, the pit lid may be configured to house the various components described above. For this embodiment of the invention, the module comprises a module pit lid suitably sized to replace pit lid (22). A RF transmitter is disposed within the module pit lid. As described above, the RF transmitter is associated with an electronic device through either a wired or wireless communication link configured for transferring system-data between the RF transmitter and the electronic device. The electronic device may be register (14) or some other device in communication with register (14). An antenna is also associated with the RF transmitter and configured for propagating data-signals generated by the RF transmitter to a remote location outside the pit. As before, such data-signals may comprise at least part of said system-data.

Figure 9:
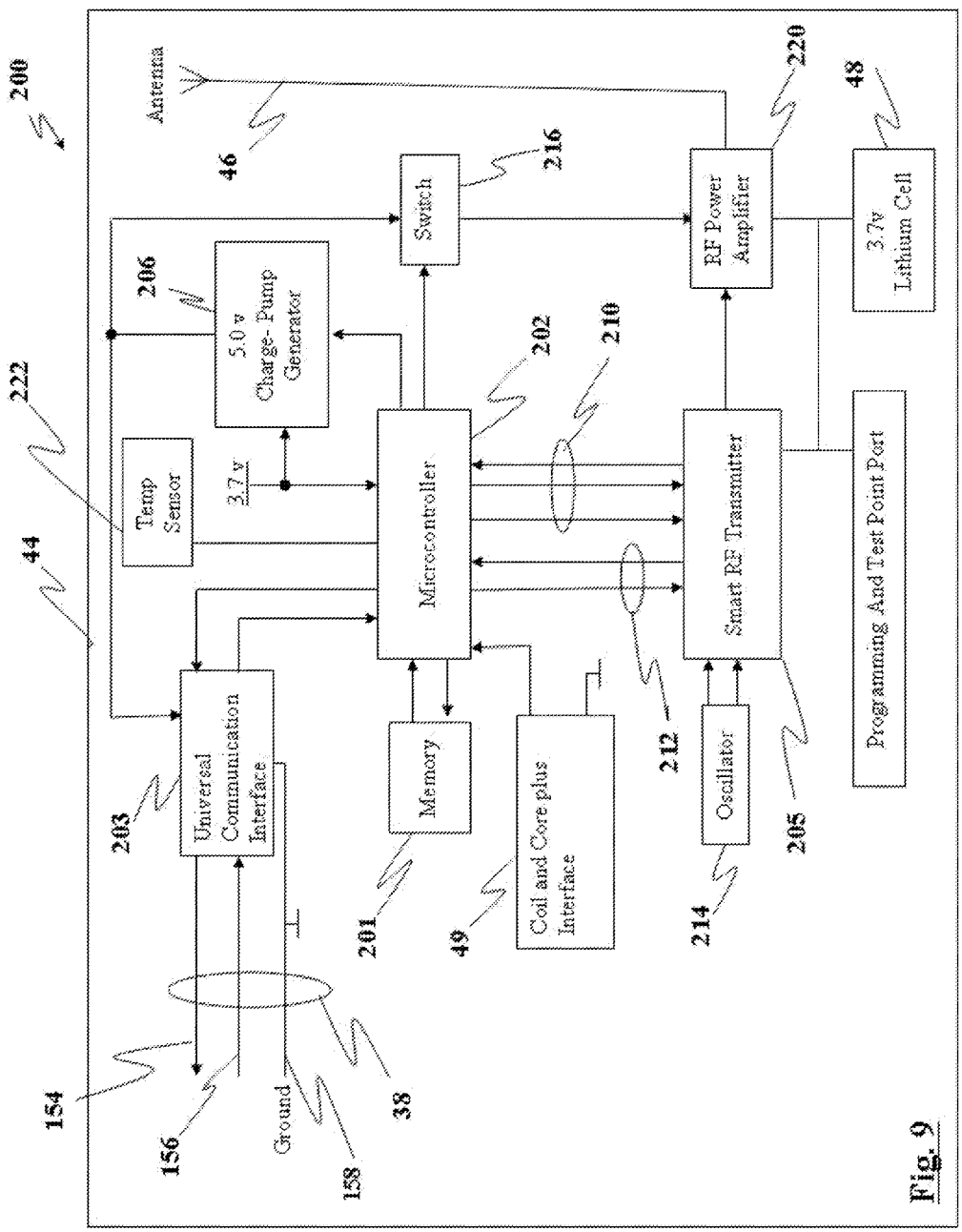
FIG. 9 is a block diagram illustration of one embodiment of a transmitter and associated circuitry.
Figure 10:
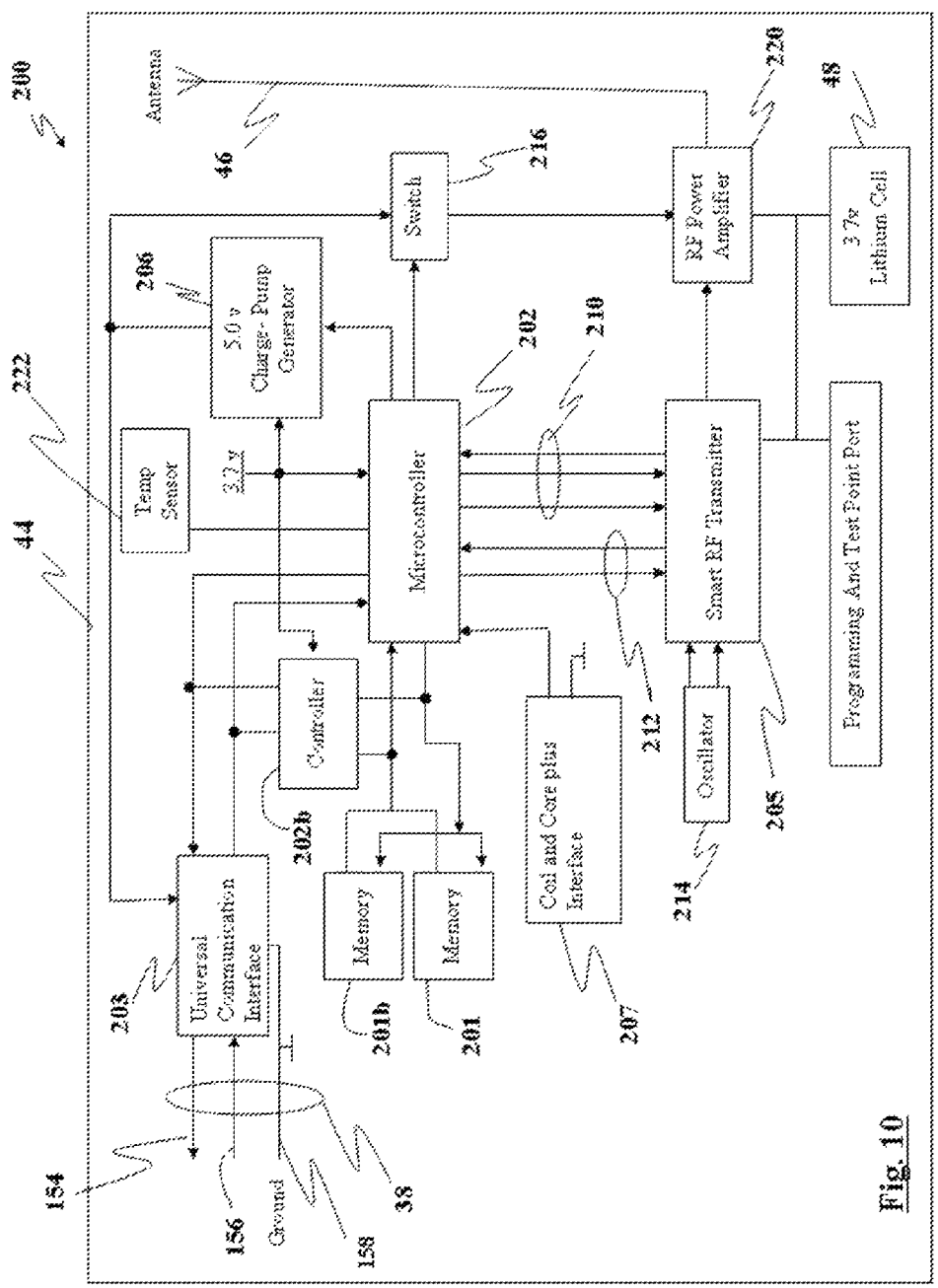
FIG. 10 is a block diagram illustration of one embodiment of a transmitter and associated circuitry including data-logger circuitry.

One embodiment of the transmitter circuitry located on circuit board (44) is now considered. Referring to FIG. 9, transmitter (200) is depicted in a block diagram representation. Transmitter (200) communicates with external devices either by transmitting a data-signal over antenna (46), through universal communication interface (203), or coil/core interface (49). In the preferred embodiment, transmitter (200) is connected to an electronic device associated with meter (10) via universal communication interface (203) and communication link (38). Such electronic device may be register (14) or an electronic device associated with register (14) and any type of communication interface may be used in place of universal communication interface (203) without departing from the scope of the present invention. Further, for some transmitter configurations comprising a receiver, such communication interfaces are configured for over air programming/reprogramming of the transmitter via a wireless communication link.

For the preferred embodiment, communication link (38) is a three conductor cable comprising a data line (154), power line (156), and a ground (158) over which serial communications is conducted. Such lines may be routed through terminal block (80) to provide a means for connecting additional electronic devices to communication apparatus (40). For example, a laptop computer may be connected through terminal block (80) to facilitate reprogramming of communication apparatus (40).

It will be appreciated that other wiring configurations and communication protocols may be used over wired or wireless communication connections and interfaces without departing from the scope of the present invention. When transmitter/reader communication interface (203) is connected to register (14) or an electronic device associated with register (14), such interface facilitates the transfer of data from electronic device/register to remote meter reading equipment via data signals propagated by antenna (46). When transmitter/reader communication interface (203) is connected to a computing device, such interface facilitates programming or reprogramming of the transmitter.

Transmitter (200) may also be programmed or reprogrammed by connecting a programming device, such as a laptop computer, inductively through coil/core interface (49). Coil/core interface (49) may also be used to perform firmware upgrades. Coil/core interface (49) may also be associated with touchpad technology to facilitate manual reading using an inductive probe.

As noted above, for one preferred embodiment, power is supplied to the transmitter electronics by power source (48) which defines at least one battery. Preferably, power source (48) is a single 3.7 Volt lithium cell battery. As noted above, in other configurations, power source (48) may be two AA lithium batteries. For system components that require greater than 3.7 volts to operate, charge pump generator (206) is used to generate a voltage larger than the supply voltage from which it operates. For this embodiment of the present invention, charge pump generator (206) generates 5 volts and powers universal communication interface (203) and RF switch (216).

Transmitter (200) further comprises processor/microcontroller (202). One of the functions of processor (202) is to control data transfers between meter register (14), memory (201), and remote meter reading equipment. It will be appreciated that memory (201) is optional and all data may be stored in memory located on processor (202). Processor (202) is further connected to coil/core interface (49). Coil/core interface (49) is used to program processor (202) as well as facilitate bios/firmware upgrades. Coil/core interface (49) may also be used by processor (202) to provide touch pad functionality to the system. Such touch pad technology is well known in the art. One example is disclosed in U.S. Pat. No. 5,619,192 issued to Ayala filed Jun. 14, 1994 and such document is incorporated by this reference for all that it discloses.

Still referring to FIG. 9, processor (202) is shown connecting to temperature sensor (222). Temperature sensor (222) may be a discrete component, as shown in FIG. 9, or it may be incorporated within processor (202). Microcontroller (202) uses temperature sensor (222) to monitor the ambient temperature within the transmitter enclosure. Alternatively, a temperature sensor may be used to monitor the temperature of a particular component. Processor (202) may also generate and store temperature-data that is later used to make adjustments to various operating parameters for transmitter (200) as described later. Such temperature-data may also be transmitted to a remote computer.

Processor (202) further connects to RF transmitter (205). RF transmitter (205) may be a single-chip transmitter or a transmitter circuit comprised of discrete components. RF transmitter (205) transmits over a frequency range of 804 MHz to 940 MHz, although other frequency bands may be used without departing from the scope of the present invention. For example, RF transmitter (205) may be used in the well known 402/426/429/433/868/916 MHz ISM/SRD band systems. For the preferred embodiment of the present invention, transmitter (205) is a single-chip design that comprises (i) a communication bus for configuring and controlling the operation of the transmitter, (ii) a programmable output power level, (iii) a programmable output frequency, and (iv) may be powered by a 3.7 volt power source or an RF scavenger based power source. Such transmitters are well known in the art and are manufactured by MAXIM, ATMEL, INFINEON, Texas Instruments, and Chipcon.

Returning to FIG. 9, antenna (46) is shown connecting to RF power amplifier (220). The types of antennas that may be used include monopole, helical, and loop antennas. Antenna (46) is constructed so that its impedance matches the output impedance of RF power amplifier (220). For the preferred embodiment of the present invention, the output impedance of RF power amplifier (220) is 50Ω.

Processor (202) configures/reconfigures RF transmitter (205) through transmitter communication interface (210). For the preferred embodiment of the present invention, transmitter communication interface (210) is a serial interface. Through transmitter communication interface (210), processor (202) can make configuration adjustments that affect the transmitter output power level, the frequency of the transmitted signal, and the transmitting mode. Processor (202) transfers the data to be transmitted over transmitter data buss (212).

In FIG. 9, oscillator (214) is shown connecting to RF transmitter (205). Oscillator (214) (one exemplary embodiment of a reference-frequency-generator) generates the reference frequency used by RF transmitter (205) to establish the carrier frequency of the transmitted signal. For the preferred embodiment, oscillator (214) is a crystal oscillator that oscillates at a frequency of 14.7456 MHz although other references may be used. RF transmitter (205) generates the carrier frequency of the transmitted signal by multiplying the output of oscillator (214) by a frequency-multiplier-value derived by an equation programmed into transmitter (205). Such frequency-multiplier-value is derived at least in part using a frequency-adjustment-value supplied by processor (202).

Frequency Stability

It is well known that a stable transmitted signal frequency is desired in almost all wireless communication systems. The more stable the transmitted signal frequency, the lower the cost of the electronics making up the receiver required to receive the transmitted signal. As noted above, for the present invention, a crystal oscillator is used to establish the reference frequency used by RF transmitter (205) to generate the carrier frequency of the transmitted signal. It will be appreciated that should the output of oscillator (214) drift, the carrier frequency of the transmitted signal will drift by such drift amount times the frequency-multiplier-value. For example, for a transmitted data-signal carrier frequency of 900 MHz and reference frequency of 14.7456 MHz, the frequency-multiplier-value would be 61.03516. If the reference frequency drifts by only 0.147456 MHz (1%) the carrier frequency will drift by about 9 MHz to 909 MHz.

Unfortunately, the outputs of all crystals drift as the temperature of the crystal changes. The more stable the crystal output frequency in response to changes in temperature, the more expensive the crystal. Fortunately, the drift of some low cost crystals substantially follow a known drift curve or known drift rate.

For one embodiment of the present invention, low cost crystals are used for oscillator (214) where the output of such crystal drifts in response to changes in temperature according to either a known frequency curve or known frequency rate (frequency-drift-data). If the frequency drifts according to a known drift rate, this value is stored in memory (201). If the frequency drifts according to a know drift curve, frequency drift/temperature change data representing such drift curve are stored in table form in memory (201). Both forms of oscillator output drift data are stored in memory (201) and are called frequency-drift-data.

For this embodiment of the present invention, processor (202) uses temperature sensor (222) to access real time (or near real time) temperature data relatable to the temperature of oscillator (214). For example, such temperature-data may be the ambient temperature within transmitter (200) enclosure, the ambient temperature within the pit (9), the temperature of at least part of the frequency-components that generate the reference-frequency. Processor (202) may store such temperature-data in memory (201) as well as transmit such temperature to a remote location.

For one embodiment, if the temperature drops below or exceeds a predefined threshold, a temperature warning may be issued. For example, a freeze warning may be issued where the temperature data drops below 32 degrees Fahrenheit. For such embodiments, Processor (202) may also compare such temperature-data to predefined temperature values. Such predefined temperature values may comprise max-temp value, min-temp value, and temp-range values. Such values are preferably predefined by a user and stored in memory (201). It should be apparent that such values would typically be selected by a user to signify possible problems should temperature sensor (222) generate temperature-data that exceeds or drops below a particular temperature value. For example, should processor (202) determine that temperature-data exceeds a predefined max-temp value, processor (202) may set a temperature-warning-flag and/or transmit at least one of the temperature-data and the max-temp value to a remote location.

Processor (202) then accesses the frequency-drift-data, determines a frequency-adjustment-value that substantially compensates for the expected drift in the reference-frequency due to a change in temperature, and sends the frequency-adjustment-value to RF transmitter (205) over transmitter communication bus (210). It should be appreciated that the frequency-adjustment-value may be incorporated into a configuration command that controls the RF transmitter (205) output frequency. Alternatively, the frequency-adjustment-value may be used by RF transmitter (205) in its calculations for determining the carrier frequency of the transmitted signal. For the purposes of this invention, regardless of whether processor (202) or RF transmitter (205) makes the frequency adjustment, a frequency-adjustment-value will be sent from processor (202) to RF transmitter (205) in one form or another (i.e. as part of a configuration command, as a discrete value, etc.).

Transmitted Power Level Stability

Considered next is the effect the status of power source (48) can have on the transmitted signal. As used in this document, the term "power quality" simply refers to any number of metrics typically used to benchmark the quality of the power provided by a power source. Such metrics include voltage level, current supplied, voltage level stability under load, etc., and provide a reference for tracking the status of a power source.

It is well known that the signal strength of a transmitted data-signal can weaken if the quality of power supplied to the transmitter/amplifier degrades beyond a certain point. For example, a transmitter may transmit a (X) dB signal when supplied with a voltage of 4.0 volts but transmit only a (X−0.5) dB signal when supplied with a voltage of 3.7 volts.

Notably, the status of power source (48) that powers RF transmitter (205) and RF power amplifier (220) may degrade over time. As a result, the quality of power supplied by power source (48) will degrade over time. As shown in FIG. 9, the output of transmitter (205) is amplified by RF power amplifier (220). Should voltage supplied by power source (48) to RF power amplifier (220) drop (as the status of the power source degrades over time), the power level of the transmitted data-signal will also drop. Thus, the status of power source (48) is another parameter that processor (202) monitors.

Initially, power-level-adjustment-data is either calculated or experimentally measured. For example, the strength of a data-signal transmitted by transmitter (205) may be monitored as the voltage supplied to transmitter 205 and/or RF power amplifier (220) is varied. Any change in transmitted data-signal strength is documented for each supplied voltage level. Such power-level-adjustment-data may be stored in table form in a memory associated processor (202).

Processor (202) is configured to measures the voltage supplied by power source (48). Processor (202) then accesses the power-level-adjustment data stored in memory (201). Using the power-level-adjustment data and the measured voltage level supplied by power source (48), processor (202) reconfigures RF transmitter (205) to transmit at a power level that maintains a substantially constant transmitted data-signal power level. This configuration may be used to provide for a substantially constant transmitted data-signal power level as power source (48) degrades over time. Processor (202) may additionally generate power source status data and may transmit such data to a remote location using RF transmitter (205).

Multiple Mode AMR Device Configurations

Figure 11:
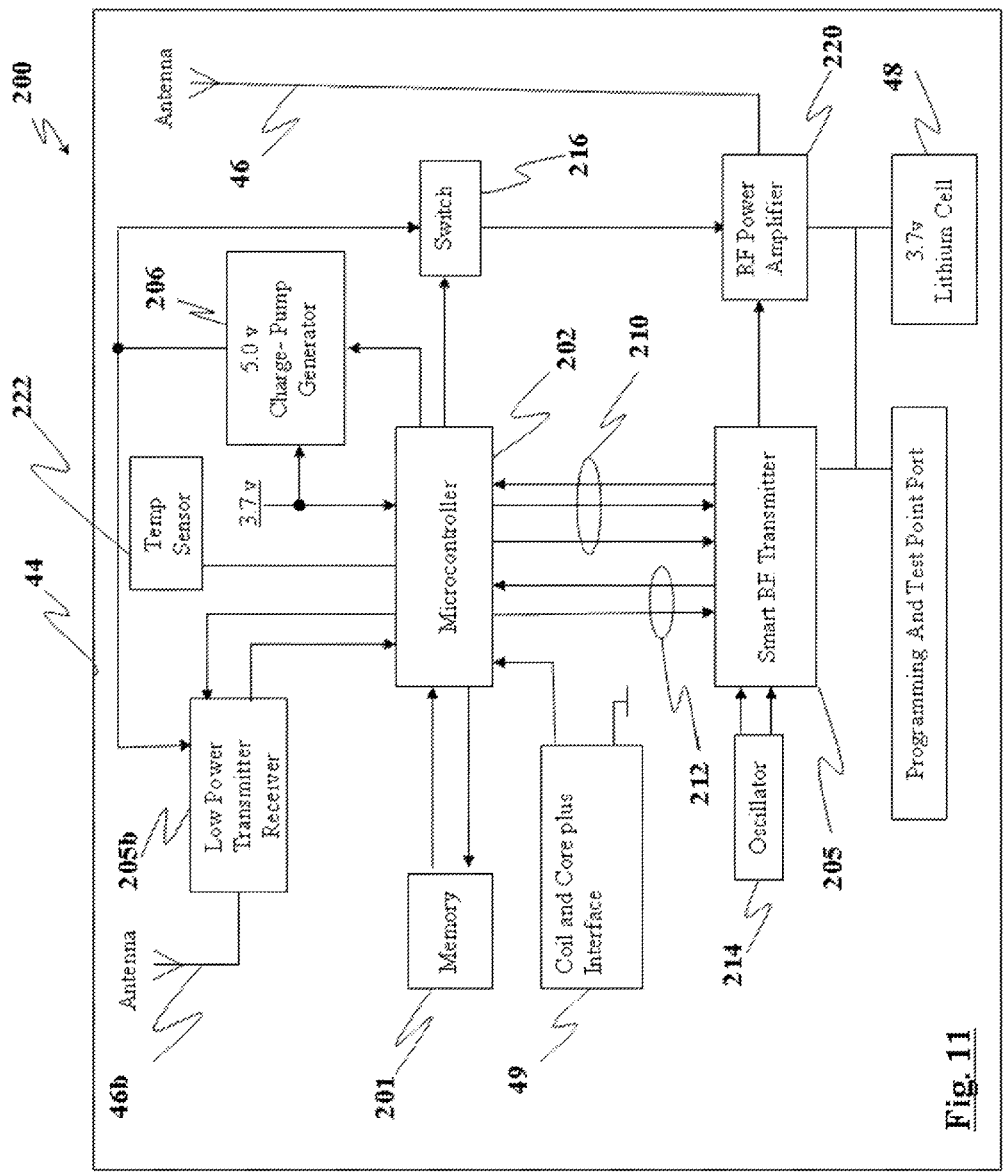
FIG. 11 is a block diagram illustration of one embodiment of a transmitter and associated circuitry including a wireless communication link comprising a receiver and a low powered transmitter.

Presented next are the modes of operation for transmitter (200) when configured as a Multiple Mode AMR device. For such configurations, FIG. 11 depicts one exemplary preferred embodiment. The components of transmitter (200) include processor (202) electrically associated a RF transmitter (205) and a either a low power transceiver (205b) or simply a receiver (not a transceiver) with transmitter (200) being electrically associated with a utility meter (10) via a wired or wireless communication connection as described above depending on the desired implementation. In addition, such a multiple mode AMR device is configured to track the passage of time.

Transmitter (200) is configured to transmit a data signal over a range of output power levels depending on the transmitter mode selected. However, for the preferred embodiment, transmitter (200) will be configured with a maximum power level (e.g. 1 watt) that the transmitted signal is not to exceed regardless of the transmitter mode selected.

Transmit Mode I: Drive-by/Walk-by Using Time Tracking Function

As noted above, transmitter (200) is powered by an exhaustible power source. Consequently, minimizing power consumption is one goal of the present invention. Thus, to assist in minimizing power consumption, for the preferred embodiment, transmitter (200) does not transmit a data-signal continuously. Instead, transmitter (200) is placed in a sleep-mode during predefined periods. While transmitter (200) does include a receiver for receiving a transmitted data signal, for this mode of operation it is assumed that the utility personnel walking by or driving by the utility meter (10) does not have the capability to transmit a wakeup signal. Consequently, there will be no wakeup signal to turn on transmitter (200) and the receiver remains inactive to conserve power. To overcome the "no wakeup signal" problem, processor (202) is configured to track the passage of time.

Processor (202) may track the passage of time using any number of well known methods and technologies for tracking time. For the preferred embodiment, processor (202) is operatively connected to a time keeping circuit that generates time-data. Such time keeping circuit may be a device external to processor (202) or internal to processor (202). Alternatively, processor (202) may track the passage of time by executing a time keeping program. For this embodiment of the present invention, processor (202) tracks the day of the week and the time of day (hour, minute, and second). Next, processor (202) accesses transmitter-schedule-data stored in a memory associated with processor (202) for determining when to transmit a data-signal. Examples of transmitter-schedule-data include a transmit start time, stop time, and transmit sequence.

Using such time-data and transmitter-schedule-data, the transmitter can be placed in a sleep-mode until processor (202) determines that a transmission session should begin. In addition, using such time-data, processor (202) can configure the transmitter to implement at least one of a plurality of possible transmitter sequences.

For the present embodiment of the invention, RF transmitter (205) is initially placed in a sleep-mode. While in sleep-mode, RF transmitter (205) consumes minimal power (or no power). Processor (202) tracks the passage of time by generating or accessing time-data. Next, processor (202) accesses the appropriate transmitter-schedule-data and compares the time-data to the transmitter-schedule-data. Examples of transmitter-schedule-data include a time period (such as 4:30 pm to 5:30 pm). When processor (202) determines that a transmission session should begin, processor (202) places transmitter (205) in a transmit-enable mode. The duration (length in time) of the transmit-enable mode may be a preset constant value or a user programmable value. While in transmit-enable mode, RF transmitter (205) may transmit a data-signal continuously or, to further conserve power, may transmit a data-signal according to a predefined transmit sequence. Restated, transmitter may be configured to transmit a data-signal for a predefined transmit-on time and then stop transmitting for a predefined transmit-off time. Such a sequence would repeat for the duration of the transmit-enable period.

Additionally, transmitter sequences may be tailored for a particular situation. For example, a walk-by transmit mode could be a transmitter sequence specifically selected for relatively slow moving persons walking through a neighborhood with remote meter reading equipment. For such situations, longer transmit-off times are desirable. Similarly, a drive-by transmit mode could be a transmitter sequence specifically selected for situations where the remote meter reading equipment will be attached to a moving vehicle. Such a transmitter sequence could be based on the speed limit in the surrounding area or a generic on-off sequence.

By way of example, consider the following transmission schedule. Processor (202) is programmed to enable the transmitter for two hours on Mondays, Wednesdays, and Fridays, beginning at 4:00 pm. Processor (202) determines that it is 4:00 pm on a Monday and processor (202) places RF transmitter (205) in transmit-enable mode. Next, processor (202) accesses transmission sequence data stored in memory (201) and determines the transmission sequence to be used. For this example, the transmission sequence is as follows, transmit data-signal for six seconds and stop transmitting data-signal for 6 seconds. Processor (202) sends the corresponding configuration commands to RF transmitter (205) over transmitter communication bus (210). RF transmitter (205) begins transmitting the data-signal for six seconds followed by a six second period without transmitting the data-signal. Processor (202) continues to track the passage of time until processor (202) determines that the current time is 6:00 pm. Next, processor (202) places the RF transmitter (205) back into sleep-mode.

In additional to saving power by limiting transmitter on times, the walk-by/drive-by configuration may be configured to transmit power at a reduced power level. In a walk-by/drive-by system, the utility meter personnel will, by definition, walk-by or drive-by relatively close to the transmitter (200). As a result, the power level of the transmitter signal can be set accordingly.

As previously noted, processor (202) may be programmed to reconfigure RF transmitter (205) to transmit over a range of power levels. For the preferred embodiment of the invention, a default Walk-by/Drive-by Power Level (WDPL) is stored in a memory associated with processor (202). For example, a default WDPL value may be 80 mW. When processor (202) determines a data signal is to be transmitted, processor (202) retrieves the WDPL value and configures RF transmitter (205) to transmit a data signal at the WDPL power level.

The WDPL value is preferably user programmable for individual units as some convenient walk-by/drive-by distances may be unusually long requiring transmitter (200) to transmit at higher power levels. Such versatility allows a default WDPL that is suitable for most installations while allowing higher WDPL values for installations where longer transmission distances are required.

Exemplary transmitter sequences may include power level, a time period, and a transmitter sequence. For example, one set of transmitter sequence values includes a WDPL value of 1 mW, time period of 4:30 pm to 5:30 pm, a transmit period of 4 s, a transmit time of 3 ms. For such transmitter sequence values, the transmitter is placed in transmit-enable mode at 4:30 pm and placed back into a sleep mode at 5:30 pm. When in transmit-enable mode, the processor sets the transmitter power level to 1mW and transmits a 3 ms data-signal every 4 seconds.

A second set of transmitter sequence values includes a WDPL value of 500 mW, time period of 4:30 pm to 5:30 pm, a transmit period of 30 s, a transmit time of 3 ms. For this example, the transmitter is placed in transmit-enable mode at 4:30 pm and placed back into a sleep mode at 5:30 pm. When in transmit-enable mode, the processor sets the transmitter power level to 500 mW and transmits a 3 ms data-signal every 30 seconds.

As the examples illustrate, when power levels are increased, the time between transmissions can be decreased as the transmitted data-signal has a longer range which means a walking person will likely be in range of such a signal for a longer period of time.

Transmit Mode II: Drive-by/Walk-by Using Receiver Function

Presented next is an alternative walk-by/Drive-by configuration that uses a receiver to listen for a wakeup signal. For such a configuration, processor (202) is configured to use receiver (205b) to listen for a wakeup signal. The utility representative uses interrogation equipment that transmits a simple wakeup signal. When such utility representative comes within range of a utility meter (as he walks or drives by the utility meter), processor (202) detects the wakeup signal and starts transmitting a data signal according to a walk-by or drive-by transmit sequence as described above. The transmitter wakeup signal may be a generic signal that wakes up a plurality of meters and/or a meter specific that only wakes up the ARM enabled meter of interest (i.e. only one meter).

It should be appreciated that having a receiver powered continuously also consumes power. Consequently, transmit mode II may also use the time tracking function and only activate the receiver according to a predefined schedule.

Transmit Mode III: Fixed Network Using Time Tracking Function

Presented now is Transmit Mode III which is a fixed network mode of operation for transmitter (200). In the fixed network mode, transmitter (200) transmits a data signal that is received by a repeater or collector which transmits the data over a wired or wireless communication link to a remote location. As before, to minimize power consumption, transmitter (200) does not transmit a data-signal continuously. Instead, transmitter (200) is placed in a sleep-mode and transmits a data signal according to a predefined transmission schedule or upon remote command.

For such a configuration, processor (202) tracks the passage of time. When the processor determines that it is time to transmit a data signal, processor (202) retrieves the necessary information to configure RF transmitter (205), configures RF transmitter (205) according to Transmit Mode III criteria and transmits a data signal. As previously noted, processor (202) may be programmed to reconfigure RF transmitter (205) to transmit over a range of power levels. For the preferred embodiment of the invention, a default (e.g. 250 mW) Fixed Network Power Level (FNPL) is stored in a memory associated with processor (202). However, such a FNPL value may be changed as required for a particular installation. Such versatility allows for a default FNPL that is suitable for most installations while allowing higher FNPL values for installations where longer transmission distances are required. Similarly, the FNPL level may be set to a value below the default value for some installations.

Additionally, the above described Fixed Network Mode may also use receiver (205*b*) to receive a data signal from a remote location. For this embodiment, processor (202) is configured to use transceiver/receiver (205*b*) to listen for a data signal. To conserve power, the receiver is preferably activated according to a receiver schedule. When processor (202) determines that it is time to active transceiver/receiver (205*b*), the receiver is turned on and processor (202) listens for a properly formatted R-data-signal.

Receiver Function—at Utility Meter

The multiple mode AMR device receiver function may be implemented in several configurations. In the simple wake up configuration, receiver (205*b*) is a simple receiver that listens for a carrier signal at a predefined frequency. In yet another configuration, the receiver (205*b*) is capable of receiving a complex data signal containing instructions to be implemented by processor (200). To conserve power, receiver (205*b*) is not in continuous operation but operates according to a receiver schedule. The receiver schedules for each ARM device is known by the utility company and if the utility company needs to contact a particular AMR device installation, a data signal is transmitted at the appropriate time that is intercepted by transceiver/receiver (205*b*) and directed to processor (202). Preferably, the utility company's transmitted data signal comprises a unique transmitter identifier so that transmitter (200) may ignore signals that do not contain the appropriate transmitter identifier.

The utility company data signal may simply be a request for transmitter (200) to retransmit meter data. The utility company's data signal may also contain information for updating configuration criteria stored in a memory associated with transmitter (200). For example, the utility company's data signal may contain information to change the WDPL, the FNPL, the drive-by/walk-by transmitter schedule, the receiver schedule, the system clock value, as well as other values.

By way of example, assume a receiver sequence includes the following values: time period, receiver on time, receiver off time. For one embodiment, the time period is 5:00 am to 5:00 pm, and 12:15 am to 1:15 am, receiver on time is 2 seconds and the receiver off time is 8 seconds. For this example, a receiver X is placed in receiver-enable mode from 12:15 am to 1:15 am and 5:00 am to 5:00 pm. When in receiver-enable mode, the receiver X listens for a properly formatted R-data-signal for 2 seconds out of 10 seconds. When a remote transmitter wishes to communicate with receiver X, the transmitter transmits a properly formatted R-data-signal for 10 seconds. IF receiver X is in receiver-enable mode, receiver X will receive and process the R-data-signal and perform the requested tasks.

Transmitter Calibration

A transmitter communicating with a receiver is similar, in some ways, to two humans communicating with each other. For example, if I whisper to you, you should probably whisper back to me, not shout back as such may damage my ears and wastes energy. For transmitters and receivers, a seminar analogy would be "if you talk to me at 1 watt and I will talk to you at 1 watt". Such a method contains at least two benefits: (1) minimal amount of energy is wasted by transmitting at too high a power level; and (2) the receiver circuits will not be saturated/damaged by an overly powerful received signal. However, as will be should be appreciated by those of ordinary skill in the art that the environments in which RF transmitters are installed are normally not static environments. Thus, a suitable transmitted power level of one day may not be strong enough on a different day.

For example, vehicles can be parked in the transmission path and buildings may be constructed in the transmission path between a transmitter and a receiver. Further, ambient weather conditions and interfering RF energy are not static. As a result, a 100 mW transmission power level may be enough on one day to transmit a signal from a utility meter to a receiver whereas on a different day a 200 mW transmission power level is required (due to some change in the environment). Such changes may be temporary (vehicle parked over transmitter) or substantially permanent. Thus, the system needs to be configured to dynamically determine the transmitter power level for the transmitter (200) associated with the utility meter (10).

For the current embodiment transmitter (200) is configured to communicate with a remote receiver such as a gateway. Such remote receiver is configured to transmit a data signal that includes the power level at which the remote receiver transmitted such data signal. Additionally, transmitter (200) is configured to receive such data signal and determined the power level of the received data signal. Transmitter (200) then subtracts the power level of the received data signal from the power level value contained within such data signal to determine the optimal power level to transmit a response data signal.

For example, suppose a remote receiver transmits a 300 mW data signal to a utility meter requesting data. The transmitted data signal contains the value "300 mW" indicating to transmitter (200) the original strength of the transmitted data signal. Upon receiving such data signal, transmitter (200) determines that the received data strength is 250 mW. Thus, transmitter (200) now knows that the transmission path loss between transmitter (200) and the receiver is 50 mW (300 mW-250 wW). Transmitter (200) can now determine the optimum transmitter power level in which to transmit a data signal in response to the receiver's request for data.

Hour Meter and Battery Life

For embodiments of transmitter (200) using a power source such as a battery, the remaining battery life of such power source is monitored.

As is already been described above, certain embodiments of transmitter (200) are configured to monitor the voltage level of a power source supplying power to the transmitter circuitry so that the stability of power level for the transmitted signal can be maintained over time. Such voltage level drops may be recorded and transmitted to a remote device where such data can be used to determine the expected life remaining in the power source.

For yet another alternative embodiment of the invention, transmitter (200) performs an hour meter function. Batteries create electron flow in a circuit by exchanging electrons in ionic chemical reactions. Further, there are a limited number of molecules in any charged battery available to react. Thus, there are a limited amount of total electrons that any battery can provide to a circuit before its "energy" is depleted. Consequently, a battery with a capacity of 1 amp-hour should be able to continuously supply a current of 1 amp to a load for exactly 1 hour. Of course, such only happens in the "ideal world" and in the real world the discharge equation is more complex. Regardless, such equations for today's batteries with appropriate correction factors can be determined.

For the currently preferred embodiment, the power discharge equation for the power source supplying power to transmitter (200) is known. Transmitter (200) executes a software routine that tracks power usage. Transmitter (200) comprises a circuit that monitors the voltage level of the power source and the current flowing from the power source and the amount of time such current is flowing from the power source. Such power usage is converted to a counter value that is stored in memory and directly relatable to such power consumption. Ironically, such power consumption monitoring is analogous to the monitoring of water consumption by utility meter. In any event, transmitter (200) may be further configured to compare the power consumption value to the batteries amp/hour rating to determine the expected remaining life of the battery.

Alternatively, transmitter (200) contains a lookup table containing the power consumption values for task performed by transmitter (200). Transmitter (200) then tracks the amount of power used over time and subtracts that value from the rated power life value to determine how much power remains within the battery.

For the above embodiment, transmitter (200) may further track statistical data that measures the amount of power used over time (such as average power consumption). For example, suppose transmitter (200) is powered by a 20 amp/hour battery (to keep the example easier to follow the values may not represent realistic values for the real world). Further suppose that transmitter (200) has determined that it has used 15 amp/hours of energy in total and that it uses an average of 0.1 amp/hour per month. With such data, transmitter (200), or a user, can calculate that the power source has to 5 amp/hours remaining (20−15) and such energy should be depleted 50 months (5/0.1=50).

Notably, transmitter (200) may be configured to perform the above calculations and transmit an expected battery life remaining value to a remote location. Alternatively, transmitter (200) may simply transmit the associated data to a remote device and a remote device may perform the necessary calculations to determine the expected battery life remaining.

RF Energy Scavenging

For the next alternative embodiment of the invention, the power source for transmitter (200) associated with the utility meter includes RF energy scavenging technology. Such RF scavenging technology is configured to convert ambient RF energy (to DC energy). Such RF energy may be broadcast by electronic devices such as cellular telephones, radio stations, television broadcast stations, computer networking systems, and many others. One of ordinary skill in the art will appreciated that a significant amount of transmitted RF energy goes unutilized. For example, a signal transmitted by a cellular telephone propagates to many locations, including the antenna design to receive such signal. Such unused energy can be intercepted, converted to DC energy, and utilized by other circuits at virtually no cost to the user. The systems using RF scavenging technology may be battery free systems or hybrid systems using both RF scavenging technology and batteries.

As noted above, one configuration using RF scavenging technology includes a photovoltaic raydome electrically associated with a battery. For such configuration, with the output of the photovoltaic raydome may be the only power source used by transmitter (200) or may be used to power both electronic circuits within transmitter (200) and provide a trickle charge to a battery. Such a system is referred to as a hybrid system. For such systems, the photovoltaic raydome may be used to power low power consumption circuits such as a timer circuit and monitoring circuits and the battery would be used for more power hungry functions such as transmitting an RF data signal over long distances.

For yet another embodiment, a battery free configuration is presented. For this embodiment of the invention, a 3.7 V power source is replaced with RF scavenging technology such as an RF-DC converter. A suitable RF-DC converter is manufactured by POWERCAST®. Alternatively, a discrete RF-DC convert circuit may be incorporated into the transmitter (200) circuit board design. Further, such RF-DC converter may be used to charge energy storage devices such as capacitors, supercaps, and for some configurations, a "hybrid battery" (i.e. a supercap merged with a battery).

When using the RF scavenging technology configuration, the system is configured to address several performance constraints including: (a) the power level of the signal transmitted by the intentional radiator (i.e. the RF source that generates the charging signal such as a cellular telephone), (b) the distance between the intentional radiator and transmitter (200) comprising the RF-DC converter, the type of receiving antenna used by transmitter (200), and the frequency of the intentionally transmitted RF signal (i.e the cell phone signal, for example).

For one configuration, transmitter (200) is incorporated into the pit lid along with the scavenging-antenna connected to the RF scavenging circuit. Preferably, such is a trace antenna that provides a plurality of selectable connection points between the RF scavenging circuit and the scavenging-antenna. Each connection point would have its own electrical length and associated size. Processor (200) is then configured to select the antenna that provides the best power to the RF scavenging circuit.

Yet another consideration is to configure transmitter (200) to minimize power consumption particularly when transmitting a data signal. For one configuration, the above described real time clock (preferably requiring only nano-amps of power) is used to keep track of time (as described above) and is configured to wake up transmitter (200) via a predefined schedule. Such predefined schedule may be for transmitter (200) to wake up and transmit a data signal or for the transmitter (200) to wake up and listen for a data signal. Such wakeup schedule may also be based upon the amount of time required for the RF scavenging circuitry to generate enough power to perform a desired task. Such desired tasks are stored in a lookup table along with the anticipated power needed to perform such task. When transmitter (200) wakes up, it determines the amount of power available, determines what tasks need to be performed, and determines which of those tasks can be performed based on the available power and performs such tasks.

For the presently preferred embodiment, the system is also configured to minimize power consumption during operation. Transmitting a data signal can easily be the most power-hungry function that transmitter (200) performs. To minimize the power consumption during transmissions, the transmission time should be kept to a minimum. Consequently, to keep transmission times to a minimum, the amount of data transmitted should be kept to a minimum. To keep the transmitted data to a minimum, a simplified communication protocol may be used thereby reducing data signal overhead. Further, the amount of utility data transmitted may be reduced to shorten transmitter on time.

Additionally, for some configurations, a local receiver is used to receive the transmitted data signal to minimize transmission distances thereby minimizing the required power level required to transmit a data signal over such distance. Such local receiver would retransmit such data to a remote device. Preferably, such local receiver would be powered by the utility grid power source. For example, for one embodiment, the local receiver would be a remote display module positioned in a water consumer's home and connected to the homes power source. Such remote display technology is disclosed in commonly owned application Ser. No. 12/050,123, the entire contents are hereby incorporated by this reference for all that it discloses for all purposes. For yet another embodiment, the local receiver may be associated with a fire hydrant. Such technology is disclosed in commonly owned application Ser. No. 12/159,360, the entire contents are hereby incorporated by this reference for all that it discloses for all purposes.

Remote Transceiver

Embodiments of the remote transceiver hardware are now considered. For this embodiment of the invention, the remote transceiver includes functionally-self-healing features. For this document, functionally-self-healing means that a hardware device is capable of compensating for certain hardware failures so that the system still functions. The main function of the system may be degraded in some manner, but the overall main function is still provided. The hardware is not self-healing, only self-compensating. Restated, technically speaking, if a piece of hardware fails or is physically damaged, such hardware will remain damaged until repaired or replaced by a human. However, the present invention can compensate for hardware failures by reallocating system resources. For example, for a functionally-self-healing system according to embodiments of the present invention, a hardware failure may slow the system down, but the main function of data collection is still provided.

Figure 12:
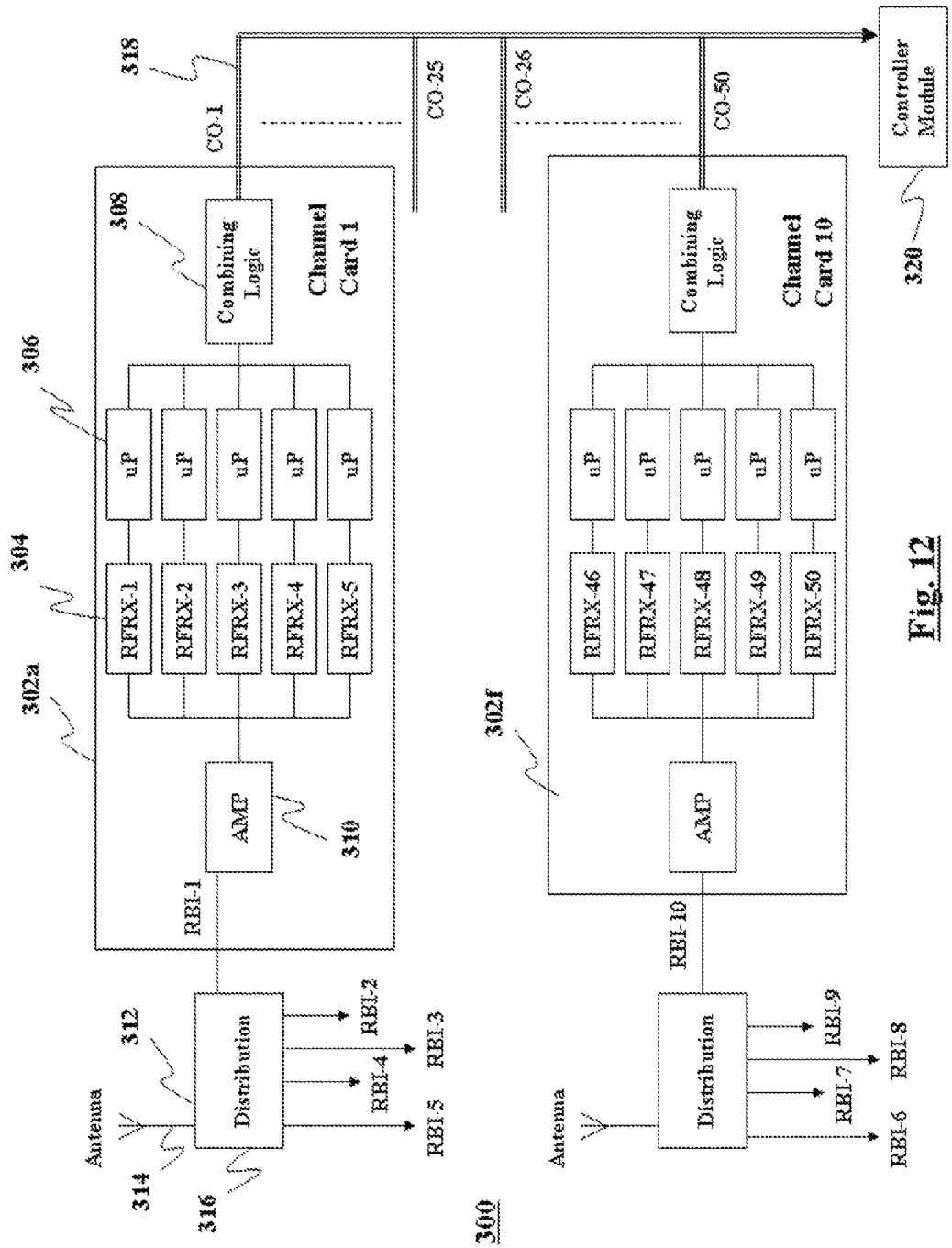
FIG. 12 is a block diagram illustration of one embodiment of a receiver module for a data collector.
Figure 13:
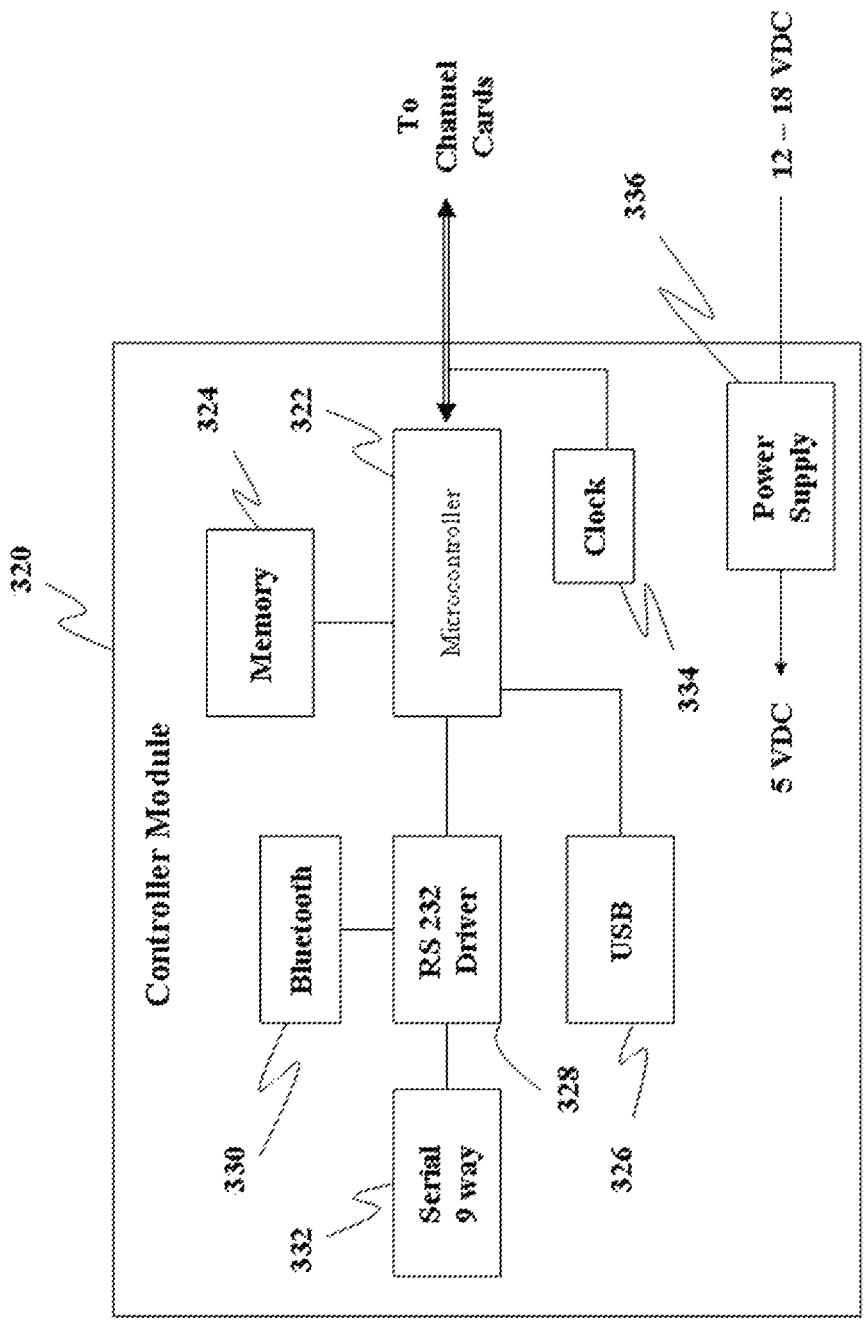
FIG. 13 is a block diagram illustration of one embodiment of a controller module for a data collector.

Referring now to FIG. 12 and FIG. 13, one exemplary embodiment of a data collector is presented. For the presently preferred embodiment, the data collector is a two section apparatus comprising a receiver module (300) electrically associated with a controller module (320) via a communication buss (318).

Receiver module (300) comprises two receiver board sets. Each receiver board set comprises five receiver-boards (302) for a total of ten receiver boards (302a-302f) (2 sets×5 boards per set=10 boards). Each receiver-board (302) comprises five programmable receivers (304) for a total of 50 receivers (304) (10 boards×5 receivers per board=50 receivers). Receiver (304) may also be referred to as a receiver channel.

For the first receiver board set, each receiver-board (302) is electrically associated with antenna (314) via a distribution circuit (316). The first receiver board set comprises receiver-board (302a) through receiver-board (302e, not shown).

Distribution circuit (316) defines signal input (RBI-1) which is electrically associated with the input of receiver board (303a). Distribution circuit (316) defines signal input (RBI-2) which is electrically associated with the input of receiver board (302b). Distribution circuit (316) defines signal input (RBI-3) which is electrically associated with the input of receiver board (302c). Distribution circuit (316) defines signal input (RBI-3) which is electrically associated with the input of receiver board (302c). Distribution circuit (316) defines signal input (RBI-4) which is electrically associated with the input of receiver board (302d). Distribution circuit (316) defines signal input (RBI-5) which is electrically associated with the input of receiver board (302e). Thus, all receiver boards receive substantially the same signal input.

Referring now to one receiver-board (302a), the RBI-1 input signal is electrically associated with the input of AMP (310). The output of AMP (310) is electrically associated with each of the five receivers (304) (RFRX-1, RFRX-2, RFRX-3, RFRX-4, and RFRX-5). Each of RFRX-1 through RFRX-5 are electrically associated with its own microcontroller (306). The output of each microcontroller (306) is electrically associated with combining logic (308). The output of combining logic (308) is electrically associated with controller module (320) via buss (318).

Suitable technologies for receivers (304) include programmable RF chips manufactured by Texas Instruments. Suitable technologies for microcontroller (306) include PICs manufactured by Microchip. Lattice Semiconductors manufactures suitable devices for performing the logic combining (308) functions.

One of ordinary skill in the art will appreciated that the above discussion for receiver board set 1 equally applies to receiver board set 2. Similarly, the above discussion for receiver boar (302a) equally applies for all receiver boards (302a-302f).

Each receiver channel functions independent of the others. For the presently preferred embodiment of the invention, each receiver channel circuit decodes the received data signal and checks such data for validity. If the data is valid, such data is transferred to the controller module (320). IF the data is invalid, the data is simply discarded. Such functionally distributes the data handling overhead amount all the channels allowing processor (322) to perform other tasks.

In addition, each microcontroller (306) monitors its respective receiver (304) and determines if there has been a channel failure. If a failure is detected, microcontroller (306) notifies processor (322). Processor (322) then generates the necessary control signals and transfers such control signals to a working receiver channel. Such control signals instruct the microcontroller (306) for the working channel to retune its receiver to the channel for the damaged receiver.

For example, assume receiver RFRX-1 is monitoring channel 1 and RFRX-10 is monitoring channel 10. Now assume RFRX-10 fails. The microprocessor (306) for RFRX-10 detects the failure and reports such failure to processor (322). Process (322) generates the necessary control signal to instruct the microprocessor (306) associated with channel RFRX-1 to tune to the RFRX-10 channel or channel 10. After receiving a data signal on channel 10, microprocessor (306) then retunes RFRX-1 back to channel 1. After receiving a data signal on the channel 1, microprocessor (306) tunes RFRX-1 back to channel 10. Such process continues until the damaged hardware is repaired or replaced. Thus, such a configuration is one example of a functionally-self-healing system.

Similarly, if an antenna (314) fails, an entire set of receivers is taken out. Under such conditions, processor (322) is configured to generate the necessary controller signals to instruct microcontrollers (306) for good receiver set to tune into the damaged receiver channels as described above. Preferably, each channel for the good receiver set would monitor two channels.

Referring now to FIG. 13, the controller module (320) is considered. Controller module (320) comprises processor (322). Processor (322) is preferably a PIC such as the ones manufacture by Microchip. The reference frequency for the system is generated by a very accurate and stable oscillator (334). Processor (322) generates receiver control signals that are transferred to individual receiver microcontrollers (306). Such control signals tell the microcontroller (306) which channel its corresponding receiver should be tuned. For example, Processor (322) generates and transfers a control signal to the microcontroller (306) electrically associated with RFRX-1. Such control signals instruct microcontroller (306) to tune RFRX-1 to channel 1 (where channel 1 is a frequency). Processor (322) generates similar control signals for each of the microcontrollers (306) thereby causing each receiver (304) to be tuned to a different channel thereby creating a 50 channel receiver system.

An exemplary data-signal comprises a meter reading, a meter identification number and status information (meter status, transmitter status, etc.). Once controller module (320) receives such data from the receiver module, such data is transferred to a data storage device electrically associated to the controller module. The connection between the data storage device and the controller module may be a serial connection (328), USB (326), or a wireless connection (330). One embodiment of a storage device is a laptop computer.

Exemplary transmission schemes are now considered. For the presently preferred embodiment of the invention, transmitter (200) is frequency hoping spread spectrum (FHSS) transmitter. Transmitter (200) is configured to transmit a data-signal on one any one of 50 possible frequencies according to the above described transmitter sequence. It should be appreciated that each frequency could be referred to as a channel. Transmitter (200) is programmed to use each channel equally. The selected channel order is randomly selected. When a channel is used, such channel is marked as used. When the next transmission is generated, the data-signal is transmitted on a channel that is not marked as used. When all channels are marked as used, all are marked unused and the process starts over again. It should be appreciated that the 50 transmitter channels are at the same frequency as the 50 receiver channels.

For one embodiment, a dual diversity antenna system is used. For this configuration, the FHSS system will have two antennas, each configured to receive twenty channels with one antenna receiving even numbers and the other antenna receiving odd numbers. The system will automatically switch modes/antennas. Such a configuration gives the receiver the ability to listen twice to minimize any skips, noise, or similar issues that may impact the receiver on the first try. Further, if one side of the dual diversity system is not functioning correctly, the other side should pick up the entire transmission thereby providing an automatic backup feature.

For yet another alternative embodiment, the remote data collector provides a direct connect feature allowing a user with a suitable device (such as a laptop computer) to direct connect to the data collector and retrieve data. Such a system configuration would be similar to a walk by system in that a person may walk up to a data collector and manually retrieve data for a plurality of meter in devices at one location. It should be obvious that such a feature, while not as "automatic" as a completely wireless system, provides a much more efficient method of reading such plurality of meter. Similarly, a person may simply drive by and retrieve the data from the data collector via an RF communication link.

For yet another embodiment of the invention, a coded wake-up signal used. For this embodiment, the remote receiver transmits a coded wake-up signal configured to instruct a transmitter (200) associated with a utility meter to perform a predefined function. For example, the coded wake-up signal can instruct the transmitter (200) which transmitter modes should be used (i.e. drive-by, walk by, fixed network, etc.). Such committee with the signal can also instruct transmitter (200) that a service/diagnostic signal will follow. Examples of service/diagnostic signals include firmware upgrades, diagnostics, time checks, battery life check, transmitter level checked. Yet another coded wake-up signal can instruct the transmitter (200) that utility resource consumption data is desired. Further, such coded wake-up signal can wake up only a subset of utility meters thereby not wasting power by waking up utility meters containing data that is not currently desired.

For systems using uncoated wake-up signals, unwanted "adjacent data" may be collected by a data collector. "Adjacent data" is defined as data from a utility meter, containing currently unwanted data, where such utility meter transmits a data signal in response to a received wake-up signal (or transmitted according to a predefined transmit time interval) and such adjacent data is received by the data collector. Traditionally such unwanted data is deleted. For one alternative embodiment of the invention, the data collector is configured to identify the unwanted data as "adjacent data" and transmit such data to the end-user. The end-user can then determine whether or not his or disposed on such "adjacent data". Notably, one of ordinary skill in the art will understand that there is nothing special about the term "adjacent data" and any term may be used to refer to unwanted data.

While the present subject matter has been described in detail with respect to specific embodiments thereof, it will be appreciated that those skilled in the art, upon attaining an understanding of the foregoing may readily adapt the present technology for alterations to, variations of, and equivalents to such embodiments. Accordingly, the scope of the present disclosure is by way of example rather than by way of limitation, and the subject disclosure does not preclude inclusion of such modifications, variations, and/or additions to the present subject matter as would be readily apparent to one of ordinary skill in the art.

What is claimed is:

1. A transmitter associated with a utility meter and configured for transmitting resource consumption data to a remote location, said transmitter comprising:

a processor, a memory, and transmitter circuitry electrically associated with an antenna;

a RF scavenger circuit electrically associated with, and configured to supply power, to at least one of said processor, said memory and said transmitter, wherein said RF scavenger circuit is configured to receive ambient RF energy and convert such RF energy to a direct current (DC) voltage;

wherein said processor is further electrically associated with a data-source containing utility-data;

wherein a function-table is stored in said memory, said function-table comprising (i) a list of functions to be performed by said transmitter, (ii) the status-value for at least one function, and (iii) a function-power-value for at least one function, wherein said function-power-value represents the amount of power required to perform said function and wherein said status-value indicates if said function needs to be performed; and wherein said processor is further configured to (a) monitor the power level supplied by said RF scavenger circuit, (b) monitor the status-value of each function associated with a status-value, and (c) perform a required function when said function's status-value indicates said function needs to be performed and there is sufficient power to perform said function.

2. A transmitter as in claim 1, wherein said processor is further configured to track the passage of time and generate time data.

3. A transmitter as in claim 2, wherein said function-table further contains a time-value for at least one function wherein said time-value indicates when a function is to be performed, and wherein said processor is further configured to monitor said time-data and perform a function when (a) a function's status-value indicates said function needs to be performed, (b) said time data and said time-value indicate it is the proper time to perform said function, and (c) the available power meets or exceeds said function-power-value.

4. A transmitter as in claim 2, further comprising a receiver electrically associated with said processor.

5. A transmitter as in claim 4, wherein in said processor is configured to use said receiver to periodically check for a wake up signal at regular intervals, varying intervals, and random intervals.

6. A transmitter as in claim 5, wherein said wakeup signal contains status-value update data and wherein said processor is configured to use said status-value update data to update the status-values stored in said function table.

7. A transmitter as in claim 5, wherein said wakeup signal contains function-data that is used by said processor to determine what function is to be performed.

8. A transmitter as in claim 1, wherein said RF scavenger circuit is at least one of (a) an RF-DC converter, and (b) a photovoltaic based circuit.

9. A transmitter as in claim 1, further comprising an energy storage device electrically associated with the output of said RF scavenger circuit, said processor and said transmitter, and wherein said energy storage device is configured to supply the energy required for said transmitter to transmit a data-signal.

10. A transmitter associated with a utility meter and configured for transmitting resource consumption data to a remote location, said transmitter comprising:
   a processor, a memory, and transmitter circuitry electrically associated with an antenna;
   a battery configured to supply power to said processor, said memory and said transmitter circuit, said battery having a known watt/time rating value indicating how many watts per unit of time said battery can supply before becoming discharged and wherein said watt/time rating value is stored in said memory;
   wherein said processor is configured to keep track of time and generate time-data;
   wherein said processor is further electrically associated with a battery monitoring circuit configured to monitor the voltage level of said battery and the current flowing from said battery to generate power-draw-data;
   wherein said processor is further configured to use said power-draw-data and said time-data to generate a power-consumption-value that indicates the amount of power per unit time that has been supplied by said battery; and
   wherein said processor is further configure to perform at least one task from the group of tasks consisting of: (a) use said power-consumption-value and said watt/time rating value to predict the remaining energy in said battery; and (b) to transmit said power-consumption-value and said watt/time rating value to a remote device.

11. A transmitter associated with a utility meter as in claim 10, wherein said processor is further configured to determine an average-power-consumption-value for a predefined period of time.

12. A transmitter associated with a utility meter as in claim 11, wherein said processor is further configured to use said average-power-consumption-value, said power-consumption-value, and said watt/time rating value to predict the amount of time before the power in said battery is depleted.

13. A transmitter associated with a utility meter as in claim 12, further comprising a RF scavenger circuit electrically associated with said battery to supply energy to said battery and wherein said processor is further configured to monitor the amount of energy supplied to said battery and adjust said power-consumption-value to reflect the added power.

14. A transmitter associated with a utility meter as in claim 12, wherein said RF scavenger circuit is configured to supply power to the processor and memory and wherein said battery is configured to supply power to said transmitter.

15. A transmitter associated with a utility meter as in claim 14, wherein said RF scavenger circuit is at least one of (a) a RF-DC converter, and (b) a photovoltaic based circuit.

16. A transceiver for transmitting data from a utility meter, said transceiver comprising:
   a processor, a memory, receiver circuitry, and transmitter circuitry wherein said transmitter circuitry and said receiver circuitry are electrically associated with an antenna;
   a RF scavenger circuit electrically associated with, and configured to supply power to, at least one of said processor, said memory, said transmitter circuitry and said receiver circuitry, wherein said RF scavenger circuit is configured to receive ambient RF energy and convert such RF energy to a direct current (DC) voltage;
   wherein a function-table is stored in said memory, said function-table comprising (i) a list of functions to be performed by said transceiver, (ii) the status-value for at least one function, and (iii) a function-power-value for at least one function, wherein said function-power-value represents the amount of power required to perform said function and wherein said status-value indicates if said function needs to be performed; and
   wherein said processor is further configured to (a) monitor the power level supplied by said RF scavenger circuit, (b) monitor the status-value of each function associated with a status-value, and (c) perform a required function when said function's status-value indicates said function needs to be performed and there is sufficient power to perform said function.

17. A transceiver for transmitting data from a utility meter as in claim 16, wherein said processor is further configured to track the passage of time and generate time-data.

18. A transceiver for transmitting data from a utility meter as in claim 17, wherein said function-table further contains a time-value for at least one function wherein said time-value indicates when a function is to be performed, and wherein said processor is further configured to monitor said time-data and perform a function when (a) a function's status-value indicates said function needs to be performed, (b) said time-data and said time-value indicate it is the proper time to perform said function, and (c) the available power meets or exceeds said function-power-value.

19. A transceiver for transmitting data from a utility meter as in claim 17, wherein in said processor configured to use said receiver to periodically check for a wake up signal at regular intervals, varying intervals, and random intervals.

20. A transceiver for transmitting data from a utility meter as in claim 19, wherein said wakeup signal contains function-data that is used by said processor to determine what function is to be performed.

\* \* \* \* \*